United States Patent
Soliman

(10) Patent No.: US 10,454,432 B2
(45) Date of Patent: Oct. 22, 2019

(54) RADIO FREQUENCY AMPLIFIERS WITH AN INJECTION-LOCKED OSCILLATOR DRIVER STAGE AND A STACKED OUTPUT STAGE

(71) Applicant: SKYWORKS SOLUTIONS, INC., Woburn, MA (US)

(72) Inventor: Yasser Khairat Soliman, Kanata (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/855,065

(22) Filed: Dec. 27, 2017

(65) Prior Publication Data

US 2018/0219516 A1 Aug. 2, 2018

Related U.S. Application Data

(60) Provisional application No. 62/440,034, filed on Dec. 29, 2016.

(51) Int. Cl.
*H03F 3/16* (2006.01)
*H03F 3/193* (2006.01)
(Continued)

(52) U.S. Cl.
CPC ............. *H03F 3/193* (2013.01); *H03F 1/223* (2013.01); *H03F 3/195* (2013.01); *H03L 7/083* (2013.01);
(Continued)

(58) Field of Classification Search
CPC .......... H03F 3/193; H03F 1/223; H03F 3/195; H03F 2200/61; H03F 2200/516;
(Continued)

(56) References Cited

U.S. PATENT DOCUMENTS

| 4,079,336 A | 3/1978 | Gross |
| 5,251,331 A | 10/1993 | Schwent et al. |

(Continued)

FOREIGN PATENT DOCUMENTS

| KR | 10-2010-0059724 | 6/2010 |
| TW | 201517506 A | 5/2015 |
| TW | 201603477 A | 1/2016 |

OTHER PUBLICATIONS

Törmäanen et al. "A 13dBm 60GHz-Band Injection Locked PA with 36% PAE in 65nm CMOS" Electrical and Information Technology, Lund University, Proceedings of the Asia-Pacific Microwave Conference 2011, 4 pages.

(Continued)

*Primary Examiner* — Khanh V Nguyen
*Assistant Examiner* — Khiem D Nguyen
(74) *Attorney, Agent, or Firm* — Knobbe Martens Olson & Bear LLP

(57) ABSTRACT

Radio frequency (RF) amplifiers, such as power amplifiers, are provided herein. In certain configurations, an RF amplifier includes an input terminal that receives an RF input signal, an output terminal that provides an RF output signal, an injection-locked oscillator driver stage that amplifies the RF input signal to generate an injection-locked RF signal, and a stacked output stage that further amplifies the injection-locked RF signal to generate the RF output signal. The stacked output stage includes a stack of at least a first transistor and a second transistor in series with one another. Thus, the stacked output stage is operable over a wide range of supply voltage to overcome the relatively low breakdown voltages of scaled transistors. Moreover, the injection-locked oscillator driver stage provides the RF amplifier with excellent power efficiency, including in applications in (Continued)

which the stacked output stage operates with a supply voltage that is variable.

20 Claims, 26 Drawing Sheets

(51) Int. Cl.
    *H03F 3/195*     (2006.01)
    *H03L 7/24*     (2006.01)
    *H03L 7/083*     (2006.01)
    *H03F 1/22*     (2006.01)

(52) U.S. Cl.
    CPC ........ *H03L 7/24* (2013.01); *H03B 2200/0074* (2013.01); *H03F 2200/411* (2013.01); *H03F 2200/451* (2013.01); *H03F 2200/516* (2013.01); *H03F 2200/61* (2013.01)

(58) Field of Classification Search
    CPC ......... H03F 2200/411; H03F 2200/451; H03L 7/083; H03L 7/24; H03B 2200/0074
    USPC ................................ 330/277, 311, 133, 302
    See application file for complete search history.

(56) References Cited

U.S. PATENT DOCUMENTS

| | | |
|---|---|---|
| 5,438,684 A | 8/1995 | Schwent et al. |
| 6,606,483 B1 | 8/2003 | Baker et al. |
| 7,053,718 B2 | 5/2006 | Dupuis et al. |
| 7,352,247 B2 | 4/2008 | Oh et al. |
| 7,409,192 B2 | 8/2008 | Lombardi et al. |
| 7,786,807 B1 | 8/2010 | Li et al. |
| 7,952,433 B2 | 5/2011 | An et al. |
| 8,131,251 B2 | 3/2012 | Burgener et al. |
| 8,803,615 B2 * | 8/2014 | Cabanillas ............... H03F 1/565 |
| | | 330/305 |
| 8,847,689 B2 | 9/2014 | Zhao et al. |
| 9,000,847 B2 | 4/2015 | Zhao et al. |
| 9,019,010 B2 | 4/2015 | Costa |
| 9,219,445 B2 | 12/2015 | Nobbe et al. |
| 9,369,087 B2 | 6/2016 | Burgener et al. |
| 9,680,416 B2 | 6/2017 | Burgener et al. |
| 10,276,521 B2 | 4/2019 | Babcock et al. |
| 2007/0075693 A1 | 4/2007 | Xi |
| 2007/0273445 A1 | 11/2007 | Sarkar et al. |
| 2008/0030282 A1 | 2/2008 | Maget et al. |
| 2011/0003571 A1 | 1/2011 | Park et al. |
| 2011/0043284 A1 * | 2/2011 | Zhao .................... H03F 1/0283 |
| | | 330/277 |
| 2012/0049894 A1 | 3/2012 | Berchtold et al. |
| 2012/0074990 A1 | 3/2012 | Sornin |
| 2012/0224407 A1 | 9/2012 | Aleksic et al. |
| 2012/0262239 A1 | 10/2012 | Taghivand et al. |
| 2012/0274409 A1 | 11/2012 | Eldesouki et al. |
| 2013/0084915 A1 | 4/2013 | Asuri et al. |
| 2013/0241662 A1 | 9/2013 | Aleksic et al. |
| 2014/0043105 A1 | 2/2014 | Zerbe et al. |
| 2014/0104010 A1 | 4/2014 | Chen et al. |
| 2014/0256271 A1 | 9/2014 | Kok |
| 2014/0266480 A1 | 9/2014 | Li et al. |
| 2015/0091658 A1 | 4/2015 | Shima et al. |
| 2015/0097031 A1 | 4/2015 | Yang et al. |
| 2015/0097629 A1 | 4/2015 | Chong |
| 2015/0155831 A1 | 6/2015 | Shirvani |
| 2015/0162877 A1 | 6/2015 | Ni |
| 2015/0270806 A1 | 9/2015 | Wagh et al. |
| 2015/0270943 A1 | 9/2015 | Liu et al. |
| 2015/0333760 A1 | 11/2015 | Zerbe et al. |
| 2015/0340992 A1 | 11/2015 | Korol et al. |
| 2016/0079993 A1 | 3/2016 | Zerbe et al. |
| 2016/0099720 A1 | 4/2016 | Bashir et al. |
| 2016/0112054 A1 | 4/2016 | Gonzalez et al. |
| 2016/0164476 A1 | 6/2016 | Wang et al. |
| 2016/0226496 A1 | 8/2016 | Aleksic et al. |
| 2016/0337117 A1 | 11/2016 | Liu et al. |
| 2016/0365994 A1 | 12/2016 | Chen et al. |
| 2017/0040941 A1 | 2/2017 | Chatwin |
| 2017/0117907 A1 | 4/2017 | Grollitsch |
| 2017/0207791 A1 | 7/2017 | Zerbe et al. |
| 2017/0288609 A1 | 10/2017 | Soliman |
| 2017/0324388 A1 | 11/2017 | Soliman |
| 2019/0097594 A1 | 3/2019 | Soliman |

OTHER PUBLICATIONS

Esswein et al., "An improved swtiched injected-locked oscillator for ranging and communications systems" Proceedings of the 43rd European Microwave Conference 2013 in 4 pages.

* cited by examiner

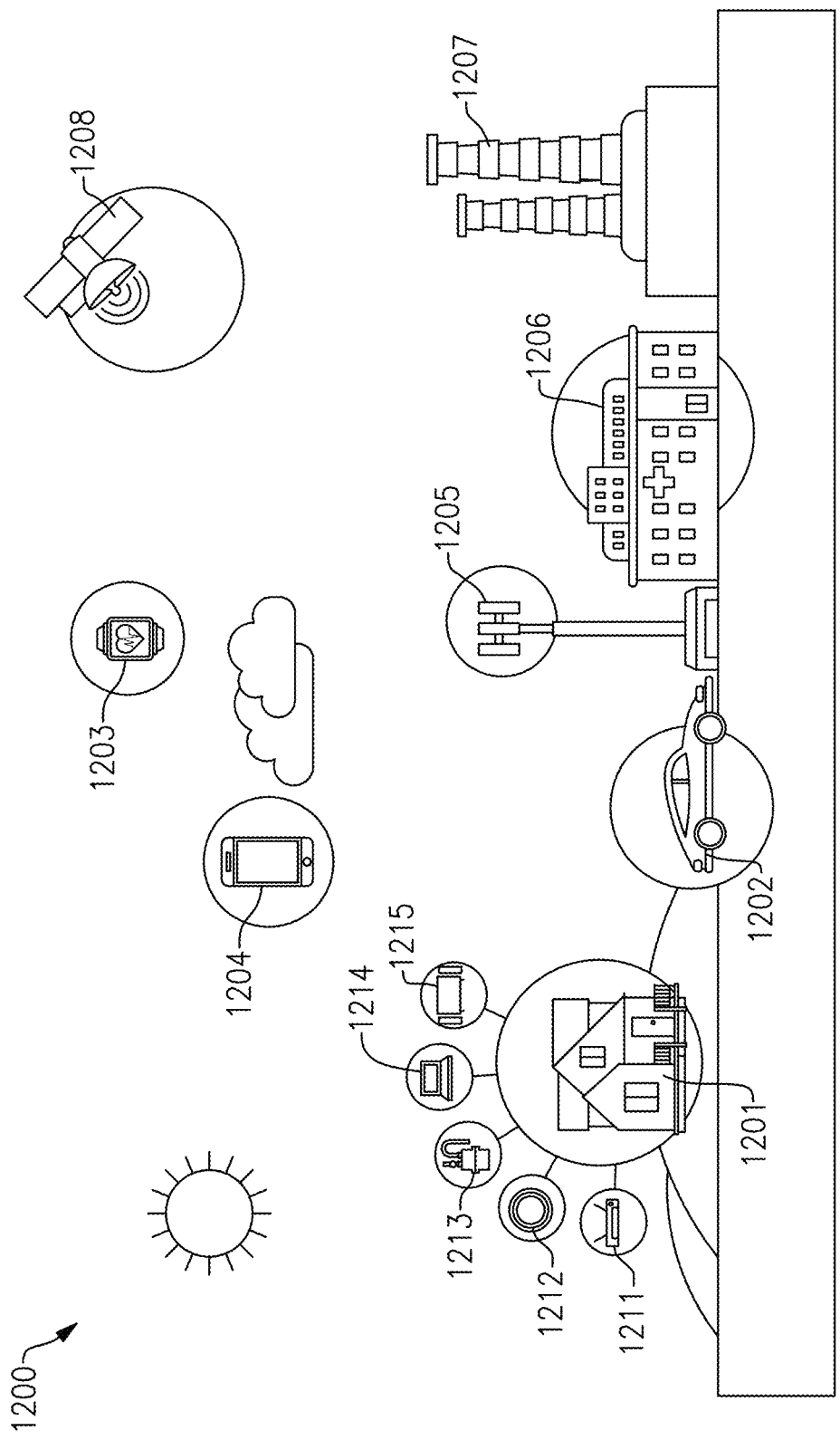

RADIO FREQUENCY AMPLIFIERS WITH AN INJECTION-LOCKED OSCILLATOR DRIVER STAGE AND A STACKED OUTPUT STAGE

CROSS-REFERENCE TO RELATED APPLICATIONS

This application claims the benefit of priority under 35 U.S.C. § 119 of U.S. Provisional Patent Application No. 62/440,034, filed Dec. 29, 2016 and titled "RADIO FREQUENCY AMPLIFIERS WITH AN INJECTION-LOCKED OSCILLATOR DRIVER STAGE AND A STACKED OUTPUT STAGE," which is herein incorporated by reference in its entirety.

BACKGROUND

Field

Embodiments of the invention relate to electronic systems, and in particular, to radio frequency (RF) electronics.

Description of the Related Technology

RF amplifiers can be used to boost the amplitude of an RF signal. Thereafter, the boosted RF signal can be used for a variety of purposes, including, for example, driving an antenna, a switch, a mixer and/or a filter in an RF system.

RF amplifiers can be included in a wide variety of wireless communications devices, including, but not limited to, mobile phones, tablets, base stations, network access points, laptops, computers, and televisions. RF amplifiers provide amplification to RF signals, which can have a frequency in the range from about 30 kHz to 300 GHz, for instance, in a range from about 450 MHz to about 6 GHz for certain communications standards.

SUMMARY

In certain embodiments, the present disclosure relates to a radio frequency amplifier. The radio frequency amplifier includes an input terminal configured to receive a radio frequency input signal, an output terminal configured to provide a radio frequency output signal, a driver stage including an injection-locked oscillator configured to generate an injection-locked radio frequency signal based on the radio frequency input signal, and a stacked output stage configured to amplify the injection-locked radio frequency signal to generate the output radio frequency signal. The stacked output stage includes a transistor stack of at least a first transistor and a second transistor in series with one another.

In some embodiments, the stacked output stage is operable in at least a first mode and a second mode. In a number of embodiments, the radio frequency amplifier further includes a bias circuit configured to bias the second transistor to a linear region of operation in the first mode, and to bias the second transistor as a switch in the second mode. In accordance with several embodiments, the stacked output stage is configured to receive a supply voltage having a lower voltage level in the second mode relative to the first mode. According to various embodiments, the radio frequency amplifier further includes a switch configured to provide the injection-locked radio frequency signal to the second transistor in the first mode, and to provide the injection-locked radio frequency signal to the first transistor in the second mode.

In accordance with certain embodiments, the first transistor is a common source transistor, and the second transistor is a common gate transistor.

In several embodiments, the driver stage is a power amplifier input stage, and the stacked output stage is a power amplifier output stage.

In some embodiments, the stacked output stage has an adjustable supply voltage that changes with a mode of the radio frequency amplifier. In accordance with various embodiments, the driver stage is powered by a substantially fixed supply voltage.

In a number of embodiments, the radio frequency input signal is a single-ended input signal, and the injection-locked oscillator includes an input transformer configured to convert the single-ended input signal to a differential input signal.

In several embodiments, the injection-locked oscillator includes a negative transconductance circuit electrically connected to an inductor-capacitor tank, and the negative transconductance circuit is configured to provide energy to the inductor-capacitor tank to maintain oscillations. In accordance with some embodiments, the injection-locked oscillator further includes a signal injecting circuit configured to provide signal injection to the inductor-capacitor tank based on the radio frequency input signal. According to a number of embodiments, the injection-locked oscillator further includes an output transformer configured to generate the injection-locked radio frequency signal at the output of the driver stage.

In certain embodiments, the present disclosure relates to a method of radio frequency signal amplification. The method includes receiving a radio frequency input signal as an input to a radio frequency amplifier having a driver stage and a stacked output stage, generating an injection-locked radio frequency signal based on the radio frequency input signal using an injection-locked oscillator of the driver stage, and amplifying the injection-locked radio frequency signal using a transistor stack of the output stage, the transistor stack including at least a first transistor and a second transistor in series with one another.

In some embodiments, the method further includes operating the stacked output stage in a selected mode chosen from at least a first mode and a second mode.

In various embodiments, the method further includes biasing the second transistor to a linear region of operation in the first mode, and biasing the second transistor as a switch in the second mode.

In several embodiments, the method further includes providing the stacked output stage with an adjustable supply voltage having a lower voltage level in the second mode relative to the first mode.

In certain embodiments, the present disclosure relates to a wireless communication device. The wireless communication device includes a transmitter configured to generate a radio frequency input signal, and a power amplifier including a driver stage and a stacked output stage. The driver stage includes an injection-locked oscillator configured to generate an injection-locked radio frequency signal based on the radio frequency input signal, and the stacked output stage is configured to amplify the injection-locked radio frequency to generate an output radio frequency signal. The stacked output stage includes a transistor stack of at least a first transistor and a second transistor in series with one another.

In various embodiments, the wireless communication device further includes a switch and an antenna electrically connected to an output of the output stage via the switch.

In several embodiments, the wireless communication device further includes a supply control circuit configured to generate the second supply voltage, and the supply control circuit is configured to receive a mode control signal from the transmitter.

In certain embodiments, the present disclosure relates to a radio frequency amplifier. The radio frequency amplifier includes an input terminal configured to receive a radio frequency input signal, an output terminal configured to provide a radio frequency output signal, a driver stage including an injection-locked oscillator configured to amplify the radio frequency input signal to generate an amplified radio frequency signal, and a stacked output stage configured to further amplify the amplified radio frequency to generate the output radio frequency signal, the stacked output stage including a transistor stack of at least a first transistor and a second transistor in series with one another.

In some embodiments, the stacked output stage is operable in at least a first mode and a second mode. According to several embodiments, the radio frequency amplifier further includes a bias circuit configured to bias the second transistor to a linear region of operation in the first mode, and to bias the second transistor as a switch in the second mode. In accordance with various embodiments, the bias circuit is configured to bias the second transistor in a saturation region of operation in the second mode. According to a number of embodiments, the bias circuit is configured to dynamically generate biases for the first transistor and for the second transistor based on a mode control signal. In accordance with several embodiments, the second transistor is a field effect transistor and the bias circuit is configured to bias the second transistor such that the second transistor has a drain-to-source voltage of less than 75 mV in the second mode. In accordance with a number of embodiments, the second transistor is a field effect transistor and the bias circuit is configured to bias the second transistor such that the second transistor has a drain-to-source voltage of less than 100 mV in the second mode. In accordance with some embodiments, the second mode is associated with a lower power than the first mode. According to several embodiments, the stacked output stage is operable in at least three different modes. According to a number of embodiments, the stacked output stage is configured to receive a supply voltage, the supply voltage having a lower voltage level in the second mode relative to the first mode. According to various embodiments, the radio frequency amplifier further includes a switch configured to provide the amplified radio frequency signal to the second transistor in the first mode, and to provide the amplified radio frequency signal to the first transistor in the second mode.

In a number of embodiments, the stacked output stage includes a third transistor in series with the first and second transistors. In accordance with several embodiments, the second transistor is arranged in series between the first transistor and the third transistor. According to various embodiments, the first transistor, the second transistor, and the third transistor are silicon-on-insulator transistors. According to several embodiments, the second transistor is a field effect transistor having a source electrically connected to the first transistor and a drain electrically connected to the third transistor. In accordance with various embodiments, the first transistor is a common source transistor, the second transistor is a common gate transistor, and the third transistor is a common gate transistor. According to several embodiments, the first transistor is a common emitter transistor, the second transistor is a common base transistor, and the third transistor is a common base transistor.

In several embodiments, the transistor stack includes at least four transistors in series with each other.

In a number of embodiments, the first transistor and the second transistor are semiconductor-on-insulator transistors.

In some embodiments, the first transistor is a common source transistor, and the second transistor is a common gate transistor.

In various embodiments, the first transistor is a common emitter transistor, and the second transistor is a common base transistor.

In accordance with a number of embodiments, the driver stage is a power amplifier input stage, and the stacked output stage is a power amplifier output stage.

In several embodiments, the radio frequency amplifier further includes an output matching network electrically connected to the output terminal. According to various embodiments, the output matching network is a class F output matching network. In accordance with several embodiments, the output matching network is a class AB output matching network.

In a number of embodiments, the stacked output stage has an adjustable supply voltage that changes with a mode of the radio frequency amplifier.

In several embodiments, the radio frequency amplifier further includes an interstage matching network providing impedance matching between an output of the driver stage and an input to the stacked output stage.

In some embodiments, the injection-locked oscillator includes an output balun configured to provide a differential to singled-ended signal conversion.

In various embodiments, the driver stage is powered by a substantially fixed supply voltage. In accordance with a number of embodiments, the stacked output stage has an adjustable supply voltage that changes with a mode of the radio frequency amplifier.

In several embodiments, the radio frequency input signal is a modulated signal having a substantially constant signal envelope.

In a number of embodiments, the radio frequency amplifier further includes an output matching network electrically connected to an output of the stacked output stage.

In some embodiments, the radio frequency input signal is a single-ended input signal, and the injection-locked oscillator includes an input transformer configured to convert the single-ended input signal to a differential input signal.

In several embodiments, the injection-locked oscillator includes a negative transconductance circuit electrically connected to an inductor-capacitor tank, and the negative transconductance circuit is configured to provide energy to the inductor-capacitor tank to maintain oscillations. In accordance with a number of embodiments, the negative transconductance circuit includes a pair of cross-coupled metal-oxide-semiconductor transistors. According to some embodiments, the injection-locked oscillator further includes a bias metal-oxide-semiconductor transistor having a gate bias voltage that controls a bias current of the negative transconductance circuit. In accordance with several embodiments, the injection-locked oscillator further includes a signal injecting circuit configured to provide signal injection to the inductor-capacitor tank based on the radio frequency input signal. According to various embodiments, the injection-locked oscillator further includes an output transformer configured to generate an amplified radio frequency signal at the output of the driver stage. In accordance with a number of embodiments, the inductor-capacitor tank includes an inductor associated with an inductance of the output transformer and a capacitor associated with a parasitic capacitance of the negative transconductance circuit.

In certain embodiments, the present disclosure relates to a method of radio frequency signal amplification. The method includes receiving a radio frequency input signal as an input to a radio frequency amplifier, the radio frequency amplifier including a driver stage and a stacked output stage, amplifying the radio frequency input signal to generate an amplified radio frequency signal using an injection-locked oscillator of the driver stage, and further amplifying the amplified radio frequency signal using a transistor stack of the output stage, the transistor stack including at least a first transistor and a second transistor in series with one another.

In some embodiments, the method further includes operating the stacked output stage in a selected mode chosen from at least a first mode and a second mode. In accordance with a number of embodiments, the method further includes biasing the second transistor to a linear region of operation in the first mode, and biasing the second transistor as a switch in the second mode. According to several embodiments, the method further includes biasing the second transistor in a saturation region of operation in the second mode. In accordance with a number of embodiments, the second mode is associated with a lower power than the first mode. According to various embodiments, the method further includes providing the stacked output stage with an adjustable supply voltage having a lower voltage level in the second mode relative to the first mode.

In a number of embodiments, the method further incudes providing output matching at an output of the radio frequency amplifier using an output matching network.

In several embodiments, the method further includes providing interstage matching between an output of the driver stage and an input to the stacked output stage using an interstage matching network.

In various embodiments, the method further includes providing a differential to singled-ended signal conversion at an output of the injection-locked oscillator.

In some embodiments, the method further includes powering the driver stage using a substantially fixed supply voltage. In accordance with a number of embodiments, the method further includes changing an adjustable supply voltage of the stacked output stage based on a mode of the radio frequency amplifier.

In several embodiments, receiving a radio frequency input signal includes receiving a modulated signal having a substantially constant signal envelope.

In a number of embodiments, the method further includes providing a single-ended to differential signal conversion at an input of the injection-locked oscillator using an input transformer.

In some embodiments, the method further includes maintaining oscillators of an inductor-capacitor tank of the injection-locked oscillator using a negative transconductance circuit. In accordance with several embodiments, the method further includes controlling a bias current of the negative transconductance circuit by controlling a gate bias of a bias metal-oxide-semiconductor transistor. According to a number of embodiments, the method further includes injecting the radio frequency input signal into the inductor-capacitor tank using a signal injecting circuit.

In certain embodiments, the present disclosure relates to a front end system. The front end system includes a low noise amplifier, a power amplifier, and a switch electrically connected to the low noise amplifier and the power amplifier. The power amplifier includes a driver stage and a stacked output stage. The driver stage includes an injection-locked oscillator configured to amplify a radio frequency input signal to generate an amplified radio frequency signal, and the stacked output stage is configured to further amplify the amplified radio frequency to generate an output radio frequency signal. The stacked output stage includes a transistor stack of at least a first transistor and a second transistor in series with one another.

In a number of embodiments, the front end system is implemented on a multi-chip module.

In various embodiments, the front end system is implemented on an integrated circuit.

In several embodiments, the switch is a first multi throw switch having at least a first throw electrically coupled to the power amplifier and a second throw electrically coupled to the low noise amplifier.

In some embodiments, the switch is a first multi throw switch having at least a first throw electrically coupled to the power amplifier and a second throw electrically coupled to the low noise amplifier.

In a number of embodiments, the first multi-throw switch further includes a third throw. In accordance with several embodiments, the front end system further includes a bypass path electrically coupled to the third throw.

In various embodiments, the front end system further includes a second multi-throw switch having at least a first throw electrically connected to the power amplifier and a second throw electrically connected to the low noise amplifier.

In several embodiments, the first multi-throw switch is configured to electrically connect an output of the power amplifier to an antenna in a first state, and the first multi-throw switch is configured to electrically connect the low noise amplifier to the antenna in a second state.

In a number of embodiments, the first multi-throw switch has at least two poles.

In some embodiments, the low noise amplifier and the power amplifier are embodied on a single die. In accordance with various embodiments, the die is a semiconductor-on-insulator die.

According to several embodiments, the front end system further includes an antenna electrically coupled to the switch.

In a number of embodiments, the front end system further includes a package enclosing the power amplifier, the low noise amplifier, and the switch.

In various embodiments, the front end system further includes a supply control circuit configured to generate the second supply voltage. According to several embodiments, the supply control circuit includes a DC-to-DC converter.

In some embodiments, the stacked output stage is operable in at least a first mode and a second mode. In several embodiments, the front end system further includes a bias circuit configured to bias the second transistor to a linear region of operation in the first mode, and to bias the second transistor as a switch in the second mode. In a number of embodiments, the bias circuit is configured to bias the second transistor in a saturation region of operation in the second mode. According to several embodiments, the bias circuit is configured to dynamically generate biases for the first transistor and for the second transistor based on a mode control signal. In accordance with a number of embodiments, the second transistor is a field effect transistor and the bias circuit is configured to bias the second transistor such that the second transistor has a drain-to-source voltage of less than 75 mV in the second mode. According to a number of embodiments, the second transistor is a field effect transistor and the bias circuit is configured to bias the second transistor such that the second transistor has a drain-to-source voltage of less than 100 mV in the second mode. According to several embodiments, the second mode is associated with a lower power than the first mode. In accordance with various embodiments, the stacked output stage is operable in at least three different modes. According to a number of embodiments, the stacked output stage is configured to receive a supply voltage, and the supply voltage having a lower voltage level in the second mode relative to the first mode. In several embodiments, the front end system further includes a switch configured to provide the amplified radio frequency signal to the second transistor in the first mode, and to provide the amplified radio frequency signal to the first transistor in the second mode.

In a number of embodiments, the stacked output stage includes a third transistor in series with the first and second transistors. In accordance with several embodiments, the second transistor is arranged in series between the first transistor and the third transistor. According to a number of embodiments, the first transistor, the second transistor, and the third transistor are silicon-on-insulator transistors. In accordance with various embodiments, the second transistor is a field effect transistor having a source electrically connected to the first transistor and a drain electrically connected to the third transistor. According to a number of embodiments, the first transistor is a common source transistor, the second transistor is a common gate transistor, and the third transistor is a common gate transistor. In accordance with several embodiments, the first transistor is a common emitter transistor, the second transistor is a common base transistor, and the third transistor is a common base transistor.

In some embodiments, the transistor stack includes at least four transistors in series with each other.

In several embodiments, the first transistor and the second transistor are semiconductor-on-insulator transistors.

In a number of embodiments, the first transistor is a common source transistor, and the second transistor is a common gate transistor.

According to various embodiments, the first transistor is a common emitter transistor, and the second transistor is a common base transistor.

In some embodiments, the stacked output stage has an adjustable supply voltage that changes with a mode of the power amplifier.

In several embodiments, the front end system further includes an interstage matching network providing impedance matching between an output of the driver stage and an input to the stacked output stage.

In a number of embodiments, the injection-locked oscillator includes an output balun configured to provide a differential to singled-ended signal conversion.

In various embodiments, the driver stage is powered by a substantially fixed supply voltage. According to a several embodiments, the stacked output stage has an adjustable supply voltage that changes with a mode of the power amplifier.

In some embodiments, the radio frequency input signal is a modulated signal having a substantially constant signal envelope.

In several embodiments, the front end system further includes an output matching network electrically connected to an output of the stacked output stage.

In a number of embodiments, the radio frequency input signal is a single-ended input signal, and the injection-locked oscillator includes an input transformer configured to convert the single-ended input signal to a differential input signal.

In various embodiments, the injection-locked oscillator includes a negative transconductance circuit electrically connected to an inductor-capacitor tank, and the negative transconductance circuit is configured to provide energy to the inductor-capacitor tank to maintain oscillations. According to a number of embodiments, the negative transconductance circuit includes a pair of cross-coupled metal-oxide-semiconductor transistors. In accordance with various embodiments, the injection-locked oscillator further includes a bias metal-oxide-semiconductor transistor having a gate bias voltage that controls a bias current of the negative transconductance circuit. According to a number of embodiments, the injection-locked oscillator further includes a signal injecting circuit configured to provide signal injection to the inductor-capacitor tank based on the radio frequency input signal. In accordance with a number of embodiments, the injection-locked oscillator further includes an output transformer configured to generate an amplified radio frequency signal at the output of the driver stage. According to several embodiments, the inductor-capacitor tank includes an inductor associated with an inductance of the output transformer and a capacitor associated with a parasitic capacitance of the negative transconductance circuit.

In certain embodiments, the present disclosure relates to a wireless communication device. The wireless communication device includes a power amplifier including a driver stage and a stacked output stage, a transmitter configured to provide the radio frequency input signal to the power amplifier, a switch, and an antenna electrically connected to an output of the stacked output stage via the switch. The driver stage including an injection-locked oscillator configured to amplify a radio frequency input signal to generate an amplified radio frequency signal, and the stacked output stage is configured to further amplify the amplified radio frequency to generate an output radio frequency signal. The stacked output stage includes a transistor stack of at least a first transistor and a second transistor in series with one another.

In a number of embodiments, the wireless communication device further includes a supply control circuit configured to generate the second supply voltage, and the supply control circuit is configured to receive a mode control signal from the transmitter.

In several embodiments, a wireless personal area network system includes the power amplifier and the transmitter, and the radio frequency input signal is a wireless personal area network signal.

In various embodiments, a wireless local area network system includes the power amplifier and the transmitter, and the radio frequency input signal is a wireless local area network signal.

BRIEF DESCRIPTION OF THE DRAWINGS

Embodiments of this disclosure will now be described, by way of non-limiting example, with reference to the accompanying drawings.

FIG. 20 is a schematic diagram of one example of an Internet of things (IoT) network.

DETAILED DESCRIPTION OF EMBODIMENTS

Figure 1:
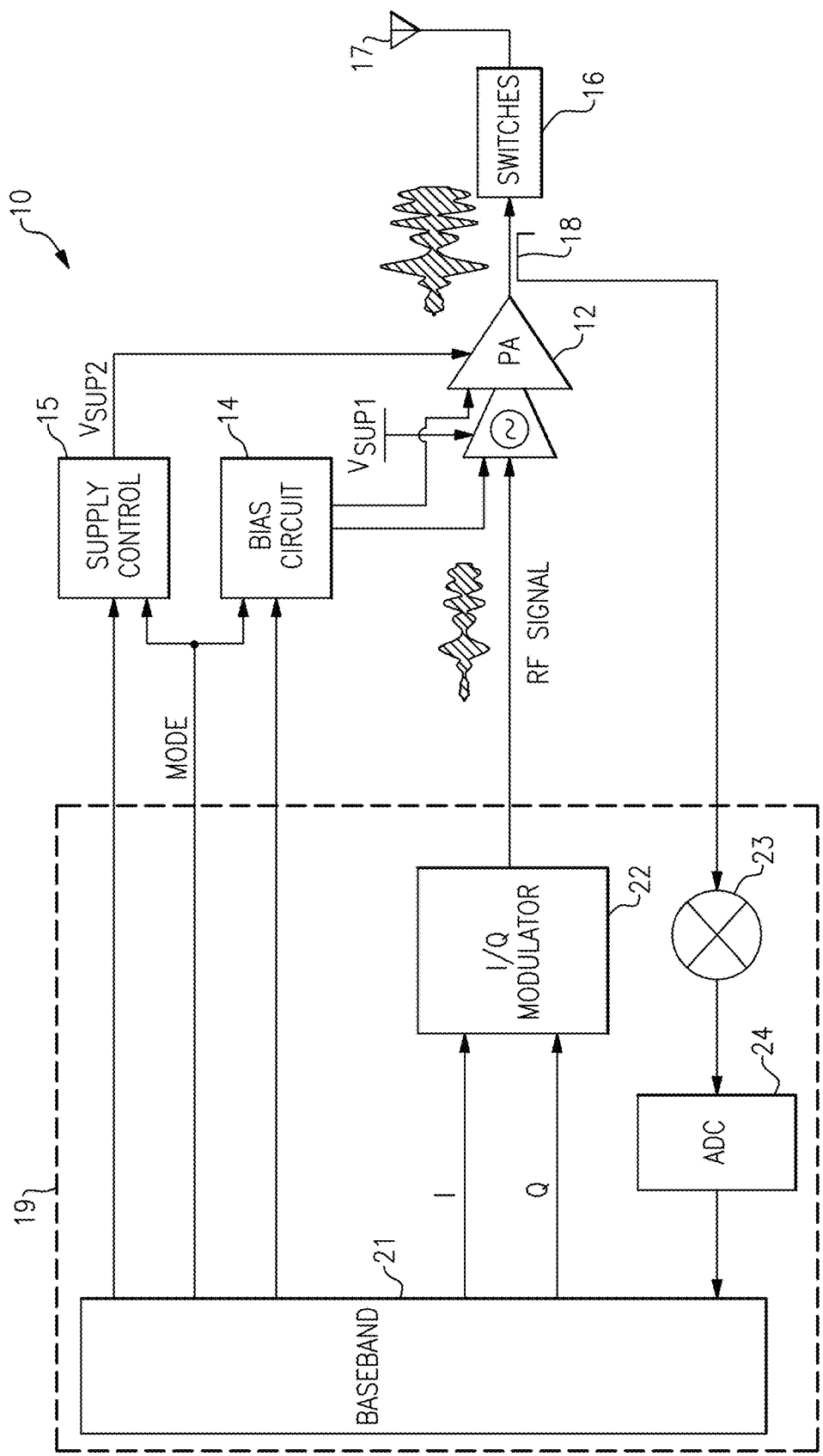
FIG. 1 is a schematic diagram of one embodiment of a power amplifier system with an injection-locked oscillator driver stage and a stacked output stage.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In certain embodiments herein, an RF amplifier, such as a power amplifier, includes an input terminal that receives an RF input signal, an output terminal that provides an RF output signal, an injection-locked oscillator driver stage that amplifies the RF input signal to generate an injection-locked RF signal, and a stacked output stage that further amplifies the injection-locked RF signal to generate the RF output signal. The stacked output stage includes a stack of at least a first transistor and a second transistor in series with one another.

Stacking transistors in an output stage can overcome relatively low breakdown voltages of scaled transistors. For example, transistor stacking can be beneficial in applications in which a stacked output stage is exposed to a relatively large voltage swing, such as a voltage swing exceeding about 2.75 Volts. Stacking several transistors, such as 3 or 4 transistors, can result in an RF amplifier with desirable operating characteristics. For instance, an RF amplifier with such stacked transistors can behave desirably for supply voltages in a range between about 3 Volts to about 3.6 Volts and voltage swings approaching about 8 Volts without experiencing significant hot carrier injection (HCI) and corresponding long-term effects of reduced transistor drain current and increased transistor leakage.

Moreover, by implementing an RF amplifier with an injection-locked oscillator driver stage, the RF amplifier exhibits excellent power efficiency, including in applications in which the stacked output stage operates with a supply voltage that is variable.

In certain implementations, an RF amplifier operates in multiple power modes. Using the same RF amplifier for several power modes can be desirable, as this can prevent increased die area and/or complications with matching networks and signal routing associated with using a different RF amplifier for each power mode.

In multi-mode applications, a supply control circuit can provide an RF amplifier with a supply voltage that can vary depending on a mode of operation of the RF amplifier. In one example, a lower supply voltage can be provided in a lower power mode and a higher supply voltage can be provided in a higher power mode. In certain configurations, the supply voltage provided to the stacked output stage can be varied depending on the power mode while a different supply voltage for the injection-locked oscillator driver stage remains substantially constant.

When a supply voltage for an RF amplifier is reduced in a lower power mode for efficiency purposes, the supply voltage can be significantly lower than for a higher power mode. In one example, the supply voltage for a lower power mode can be about 60% below the supply voltage for a higher mode. Such a reduction in supply voltage can result in reduced drain-to-source voltage ($V_{DS}$) headroom operation that drives stacked field-effect transistor (FET) topologies into early power compression, which can in turn reduce the attainable output 1 dB compression point (OP1 dB), saturated power ($P_{SAT}$), and/or power-added efficiency (PAE).

In certain configurations, an RF amplifier includes a bias circuit that biases the stacked transistors of the stacked output stage based on mode. In one example, the bias circuit can bias a transistor in a stack to a linear region of operation in a first mode, and bias the transistor as a switch in a second mode. Accordingly, the bias circuit can bias the stacked output stage such that the stacked output stage behaves like there are fewer transistors in the stack in the second mode relative to the first mode. Such operation can result in meeting design specifications for different power modes, in which a supply voltage provided to the stacked output stage is lower in the second mode relative to the first mode.

For example, in a stacked silicon-on-insulator (SOI) power amplifier application, the stacked output stage can include a common source transistor in series with one or more common gate transistors. This can prevent breakdown during high and/or medium power modes of operation (e.g., modes in which a supply voltage for the output stage are 3 Volts and 1.8 Volts, respectively). In the lowest power mode of operation (e.g., a mode with a supply voltage for the output stage of 1.2 Volts), both the specified power supply level and the voltage swing can be better accommodated by having at least one less transistor in the stack. In certain implementations, a common gate transistor in the stacked output stage is operated as a switch (as opposed to a common gate stage) by turning it ON hard enough such that its $V_{DS}$ is sufficiently low (e.g., less than about 100 mV or less than about 75 mV) to thereby reduce and/or minimize its effect on the headroom and allowing improved OP1 dB and $P_{SAT}$ (e.g., about 13 dBm).

Accordingly, certain embodiments herein can be used to overcome problems associated with operating a stacked-transistor SOI power amplifier topology in multiple modes of operation with a relatively large difference in supply voltage provided to the power amplifier in different modes of operation. For instance, a triple-stacked-transistor SOI power amplifier operable in three power modes in which a lowest power-mode has a supply voltage that is about 60% below the supply voltage for a highest power mode can operate with desirable performance in accordance with the principles and advantages discussed herein.

Moreover, using an injection-locked oscillator driver stage provides the RF amplifier with high efficiency, including in a low power mode. For example, in the low power mode, the adjustable supply voltage used to power the stacked output stage is decreased, and the driver stage has a relatively large impact on overall efficiency of the RF amplifier. By implementing the driver stage using an injection-locked oscillator, the overall efficiency of the RF amplifier is relatively high across different modes. Thus, the RF amplifiers discussed herein can be used to overcome efficiency issues in applications in which a driver stage operates using a fixed voltage and an output stage operates with large differences in supply voltage in different modes.

Embodiments of this disclosure can be implemented with semiconductor-on-insulator technology, such as SOI technology. Using SOI technology can enable RF amplifiers to be implemented in a relatively inexpensive and reliable manufacturing process. Moreover, the desirable performance of low noise amplifiers (LNAs) and/or radio frequency (RF) switches in SOI technology enables an RF amplifier to be implemented as part of a complete front end integrated circuit (FEIC) solution that includes transmit, receive, and switching functionality. In certain implementations herein, the RF amplifier serves as a power amplifier of a communications device.

FIG. 1 is a schematic diagram of a power amplifier system 10. The illustrated power amplifier system 10 includes a power amplifier 12, a bias circuit 14, a supply control circuit 15, switches 16, an antenna 17, a directional coupler 18, and a transmitter 19. The illustrated transmitter 19 includes a baseband processor 21, an I/Q modulator 22, a mixer 23, and an analog-to-digital converter (ADC) 24. The transmitter 19 can be included in a transceiver that also includes circuitry associated with receiving signals from an antenna (for instance, the antenna 17) over one or more receive paths.

The power amplifier system 10 of FIG. 1 is operable in multiple modes of operation. The multiples modes of operation can include at least two different modes of operation in which the supply control circuit 15 provides a supply voltage $V_{SUP2}$ having different voltage levels to the power amplifier 12. In certain implementations, the bias circuit 14 can bias the power amplifier differently in the at least two different modes of operation.

The power amplifier 12 includes an injection-locked oscillator driver stage and a stacked output stage, which can be implemented in accordance with any of the teachings herein. Although the power amplifier system 10 of FIG. 1 illustrates one example of an electronic system that can include an injection-locked oscillator driver stage and a stacked output stage, the teachings herein are applicable to a wide variety of electronic systems.

In the illustrated embodiment, the power amplifier 12 amplifies an RF signal received from the I/Q modulator 22 of the transmitter 19. The amplified RF signal generated by the power amplifier 12 can be provided to the antenna 17 by way of the switches 16. The power amplifier 12 can be operated in multiple modes, such as multiple power modes. The power amplifier 12 can include a stacked transistor topology, such as any of the stacked topologies discussed herein. The power amplifier 12 can be implemented by silicon-on-insulator technology. The power amplifier 12 can include field effect and/or bipolar transistors.

As shown in FIG. 1, the power amplifier's injection-locked oscillator driver stage receives a first supply voltage $V_{SUP1}$, and the power amplifier's stacked output stage receives a second supply voltage $V_{SUP2}$.

In certain implementations, the supply control circuit 15 is included to change the voltage level of the second supply voltage $V_{SUP2}$ based on mode of operation. The supply control circuit 15 can be any suitable circuit to provide the supply voltage $V_{SUP2}$ to the power amplifier 12. The supply control circuit 15 can include a direct current to direct current (DC-DC) converter, for example. The supply control circuit 15 can include any other suitable switching regulator, such a buck and/or boost converter, in certain implementations.

In certain implementations, the voltage level of the second supply voltage $V_{SUP2}$ can be significantly lower (e.g., about 60% lower) in one mode of operation relative to another mode of operation. Significant differences in the voltage level of the supply voltage can result in reduced headroom operation that can drive a stacked transistor circuit topology into early power compression. Early power compression can degrade performance of the power amplifier 12. For instance, early power compression can reduce OP1 dB, $P_{SAT}$, PAE, the like, or any combination thereof of the power amplifier 12.

The bias signals received by the power amplifier 12 from the bias circuit 14 can bias the power amplifier 12 for operation in the various modes of the multiple modes. The bias circuit 14 can be implemented by any suitable bias circuit for the power amplifier 12.

In certain implementations, the bias circuit 14 can bias a stacked transistor of the power amplifier's stacked output stage to a linear region of operation in a first mode and bias the transistor as a switch in a second mode in which the voltage level of the supply voltage $V_{SUP}$ is significantly lower than in the first mode. For instance, a common gate transistor (or a common base transistor in a bipolar implementation) of the stacked output stage can be operated in the linear region in the first mode and turned ON hard to act as a switch in the second mode. This can reduce or eliminate the common gate transistor's effect on headroom when the transistor is biased as a switch. Accordingly, the OP1 dB and $P_{SAT}$ can be improved in the second mode.

In the illustrated power amplifier system 10, the directional coupler 18 is positioned between the output of the power amplifier 12 and the input of the switches 18, thereby allowing a measurement of output power of the power amplifier 12 that does not include insertion loss of the switches 17. The sensed output signal from the directional coupler 18 can be provided to the mixer 23, which can multiply the sensed output signal by a reference signal of a controlled frequency so as to downshift the frequency content of the sensed output signal to generate a downshifted signal. The downshifted signal can be provided to the ADC 24, which can convert the downshifted signal to a digital format suitable for processing by the baseband processor 21.

By including a feedback path between the output of the power amplifier 12 and the baseband processor 21, the baseband processor 21 can be configured to dynamically adjust the I and Q signals to optimize the operation of the power amplifier system 10. For example, configuring the power amplifier system 10 in this manner can aid in controlling the power added efficiency (PAE) and/or linearity of the power amplifier 12.

The baseband signal processor 21 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 22 in a digital format. The baseband processor 21 can be any suitable processor configured to process a baseband signal. For instance, the baseband processor 21 can include a digital signal processor, a microprocessor, a programmable core, or any combination thereof. Moreover, in some implementations, two or more baseband processors 21 can be included in the power amplifier system 10.

The I/Q modulator 22 can receive the I and Q signals from the baseband processor 21 and to process the I and Q signals to generate an RF signal. For example, the I/Q modulator 22 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the power amplifier 12. In certain implementations, the I/Q modulator 22 can include one or more filters configured to filter frequency content of signals processed therein.

Transistor stacking can be implemented in silicon-on-insulator power amplifiers. For instance, such transistor stacking can be implemented in the power amplifier 12 of FIG. 1. The transistor stacking can overcome relatively low breakdown voltages of scaled transistors, especially when exposed to voltage swing exceeding a voltage swing that can be accommodated by each transistor in the stacked such as 2.75 Volts.

Moreover, the illustrated power amplifier 12 uses an injection-locked oscillator driver stage, which provides the power amplifier 12 with high efficiency, including in a low power mode in which the voltage level of second supply voltage $V_{SUP2}$ is relatively low.

Figure 2:
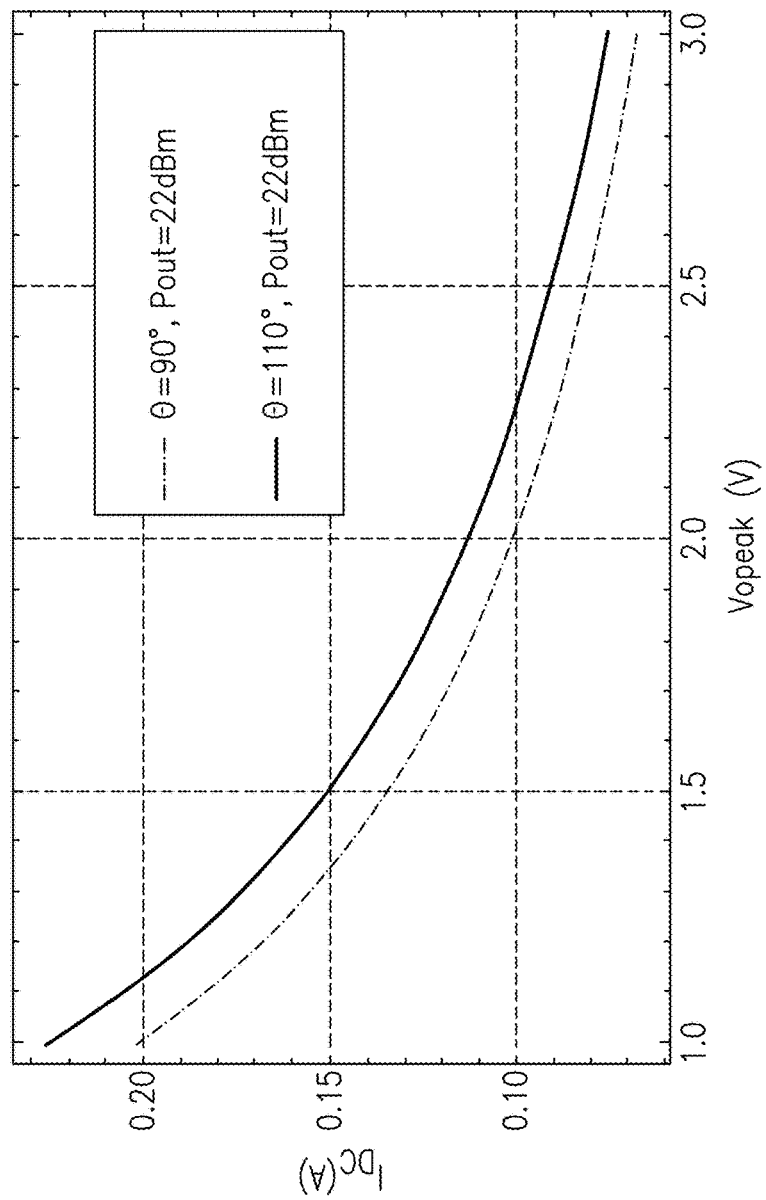
FIG. 2 is a graph illustrating a relationship between peak output voltage and direct current (DC) current for different conduction angles of a stacked output stage at a fixed output power level.

FIG. 2 is a graph illustrating a relationship between peak output voltage and direct current (DC) current for conduction angles of a stacked output stage at a fixed output power level. The graph includes a first plot for a conduction angle of about 90 degrees and an output power level of about 22 dBm. Additionally, the graph includes a second plot for a conduction angle of about 110 degrees and an output power level of about 22 dBm.

Figure 3A:
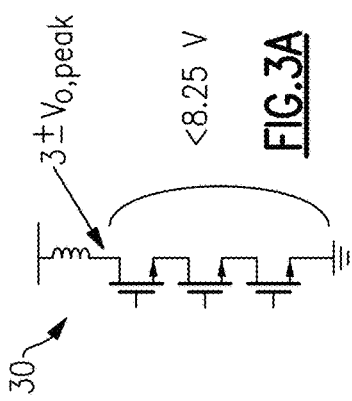
FIG. 3A illustrates a stacked output stage with three transistors in the stack and a maximum allowable voltage swing of the stacked output stage for a supply voltage.

FIG. 3A illustrates a stacked output stage 30 with three transistors in the stack and a voltage swing of the stacked output stage for a supply voltage. For one example fabrication process, stacking three transistors as shown in FIG. 3A can enable amplifier operation to work well with supply voltages between about 3 Volts to 3.6 Volts and voltage swings approaching greater than 8 Volts. For instance, when each transistor in the stack can accommodate a voltage swing of up to about 2.75 Volts, the three stacked transistors can together accommodate a voltage swing of up to about 8.25 Volts without experiencing significant hot carrier injection (HCI) and corresponding long-term effects of reduced transistor drain current and increased transistor leakage.

Figure 3B:
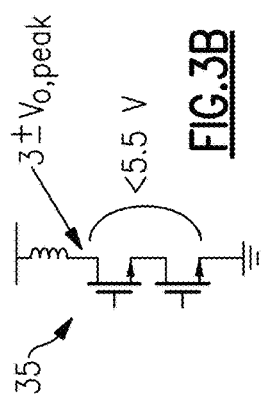
FIG. 3B illustrates a stacked output stage with two transistors in the stack and a maximum allowable voltage swing of the stacked output stage for the same supply voltage as FIG. 3A.

FIG. 3B illustrates a stacked output stage 35 with two transistors in the stack and a voltage swing of the stacked output stage for the same supply voltage as FIG. 3A. Compared to the stacked output stage 30, the stacked output stage 35 can accommodate about two thirds of the voltage swing. As an example, when each transistor in the stacked output stage 35 can accommodate a voltage swing of up to about 2.75 Volts, the two stacked transistors can together accommodate a voltage swing of up to about 5.5 Volts without introducing significant HCI effects. Accordingly, the stacked output stage 35 may not be suitable for applications with voltage swings of greater than 5.5 Volts, in this example. As such, for applications with voltage swings of greater than 5.5 Volts, three or more transistors can be included in series with each other in a stacked output stage.

For amplifiers operable with variable supply voltage levels in multiple power modes, headroom can be reduced in lower power modes with lower supply voltages. This can drive the stacked output stage into early compression, which can reduce OP1 dB and PAE. By having at least one less transistor in the stack, problems associated with reduced headroom can be reduced or eliminated.

Accordingly, the stacked output stage 35 can be more suitable than the stacked output stage 30 when the supply voltage has a lower voltage level. In certain implementations herein, a stacked output stage is biased such that they behave like the stacked output stage 30 in a first mode with a supply voltage having a relatively high voltage level and such that they behave like the stacked output stage 35 in a second mode with the supply voltage having a relatively low voltage level. As such, this biasing can enable the stacked output stage to accommodate a relatively high voltage swing when the supply voltage has a relatively high voltage level and also to reduce or eliminate problems associated with headroom when the supply voltage has a relatively low voltage level.

Figure 4A:
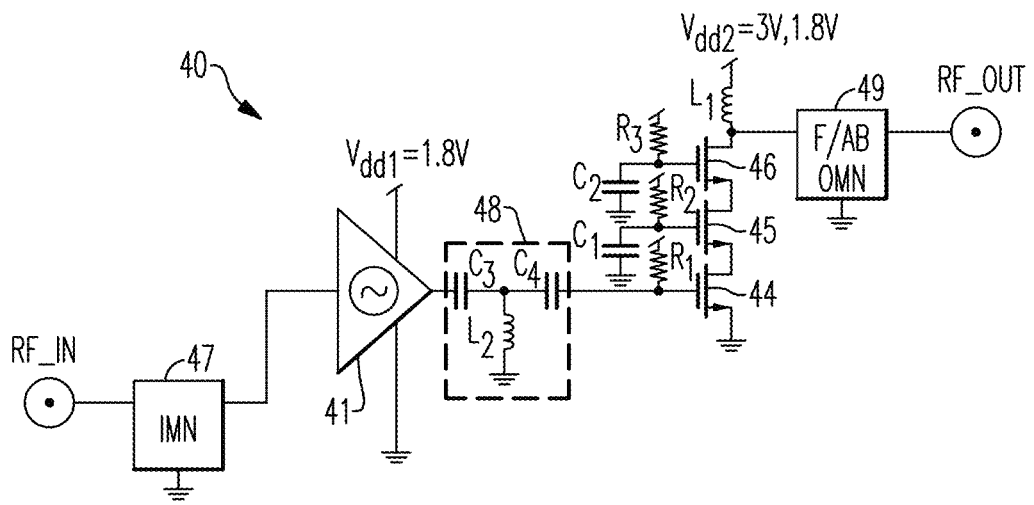
FIG. 4A is a schematic diagram of one embodiment of an RF amplifier with conceptual biasing illustrated for a first mode of operation of a stacked output stage.

FIG. 4A is a schematic diagram of one embodiment of an RF amplifier 40 with conceptual biasing illustrated for a first mode of operation of a stacked output stage. The illustrated RF amplifier 40 includes an injection-locked oscillator driver stage 41, a stacked output stage, matching networks, and biasing circuit elements. The RF amplifier 40 can receive an RF input signal RF_IN and provide an amplified RF output signal RF_OUT.

As shown in FIG. 4A, the injection-locked oscillator driver stage 41 receives an input stage supply voltage $V_{dd1}$. In certain implementations, the input stage supply voltage $V_{dd1}$ is substantially fixed.

The stacked output stage of the illustrated RF amplifier 40 includes a triple-stacked output stage. The illustrated stacked output stage includes two common gate transistors 45 and 46 in series with a common source transistor 44. The transistors 44, 45, and 46 can be silicon-on-insulator transistors. The transistor 45 can be biased to a linear region of operation by conceptual biasing circuit element $R_2$. Similarly, the transistor 46 can be biased to a linear region of operation by conceptual biasing circuit element $R_3$. The conceptual bias circuit elements $R_2$ and $R_3$ can be implemented by any suitable biasing circuit elements and can include circuitry in additional to and/or in place of the illustrated resistors. AC grounding gate capacitors $C_1$ and $C_2$ can be electrically connected to gates of the common gate transistors 45 and 46, respectively. The transistor 44 can be biased by a biasing circuit element $R_1$.

Such a triple-stacked output stage can prevent breakdown in modes of operation in which an output stage supply voltage $V_{dd2}$ is 3 Volts and 1.8 Volts, respectively, for example. In the circuit illustrated in FIG. 4A, the output stage supply voltage $V_{dd2}$ being 3 Volts corresponds to a first mode and the output stage supply voltage $V_{dd2}$ being 1.8 Volts corresponds to a third mode.

The RF amplifier 40 can include matching networks for impedance matching. The illustrated matching networks include an input matching network 47, an inter-stage matching network 48, and an output matching network 49. In FIG. 4A, an input matching network 47 is electrically connected to the input of the injection-locked oscillator driver stage 41. The illustrated inter-stage matching network 48 includes capacitors $C_3$ and $C_4$ and inductor $L_2$. The output matching network 49 can be a class F output matching network, a class AB output matching network, or any other suitable output matching network.

Figure 4B:
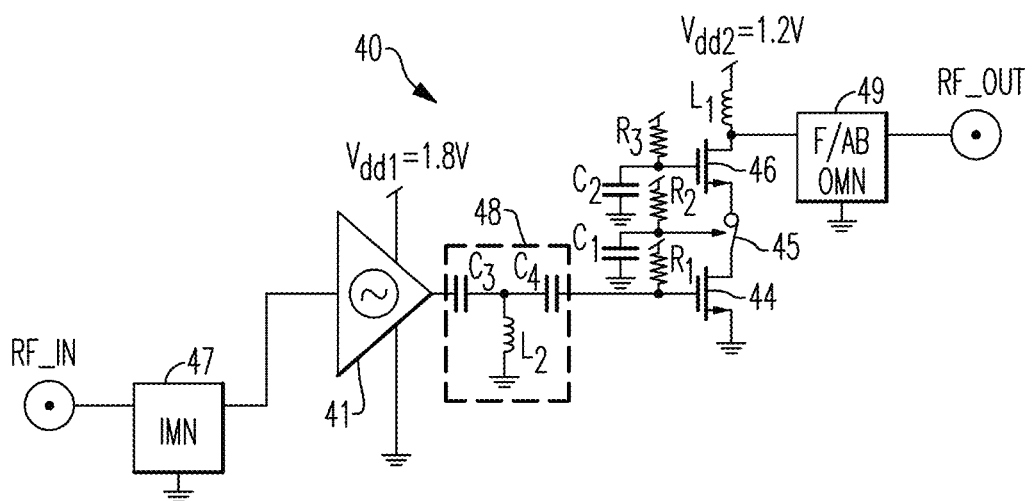
FIG. 4B is a schematic diagram of the RF amplifier of FIG. 4A with conceptual biasing illustrated for a second mode of operation of the stacked output stage.

FIG. 4B is a schematic diagram of the power amplifier system 40 of FIG. 4A with biasing illustrated for a second mode of operation according to an embodiment. The second mode of operation can be a lower power mode than the modes associated with the biasing in FIG. 4A. As illustrated in FIG. 4B, the output stage supply voltage $V_{dd2}$ is 1.2 Volts. The common gate transistor 45 is biased so as to operate as a switch instead of a common gate stage in FIG. 4B. The common gate transistor 45 can be turned ON hard enough such that its $V_{DS}$ is sufficiently low (e.g., less than about 100 mV or less than about 75 mV) to make its effect on headroom insignificant. This can allow the $P_{SAT}$ to about around 13 dBm in the second mode of operation, in certain implementations.

Accordingly, the RF amplifier 40 can operate in at least three different power modes with different output stage supply voltages. In the example of FIGS. 4A and 4B, the output stage supply voltage $V_{dd2}$ can be 3 Volts in a high power mode, the output stage supply voltage $V_{dd2}$ can be 1.8 Volts in a medium power mode, and the output stage supply voltage $V_{dd2}$ can be 1.2 Volts in a low power mode. The high power mode can be a first mode, the lower power mode can be a second mode, and the medium power mode can be a third mode. The common gate transistor 45 can be biased to a linear region of operation in the high power mode and the medium power mode, as illustrated in FIG. 4A. In the low power mode, the common gate transistor 45 can be biased to as a switch, as illustrated in FIG. 4B. As such, the same RF amplifier can be used in multiple power modes of operation while meeting performance specifications for each of the multiple power modes.

FIGS. 4A and 4B show an embodiment of RF amplifier 40. FIGS. 5A to 8B illustrate embodiments of stacked output stages and bias circuits. Any of the principles and advantages discussed with reference to any of these figures can be implemented in any of the embodiments disclosed herein.

Figure 4C:
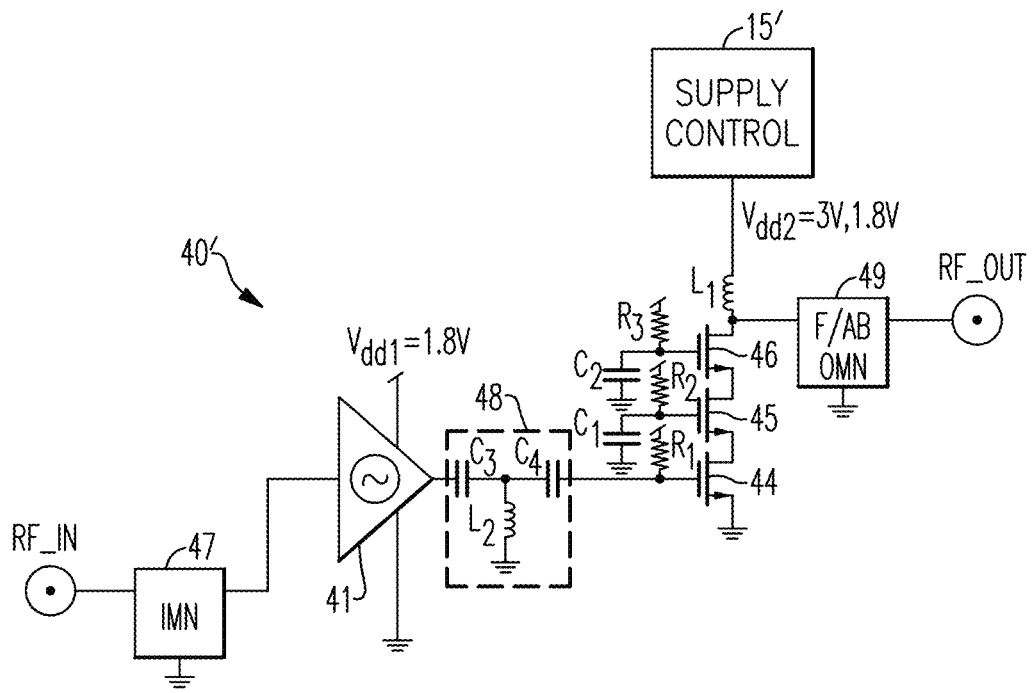
FIG. 4C is a schematic diagram of another embodiment of an RF amplifier with conceptual biasing illustrated for a first mode of operation of a stacked output stage.

FIG. 4C is a schematic diagram of another embodiment of an RF amplifier 40' with conceptual biasing illustrated for a first mode of operation of a stacked output stage.

Figure 4D:
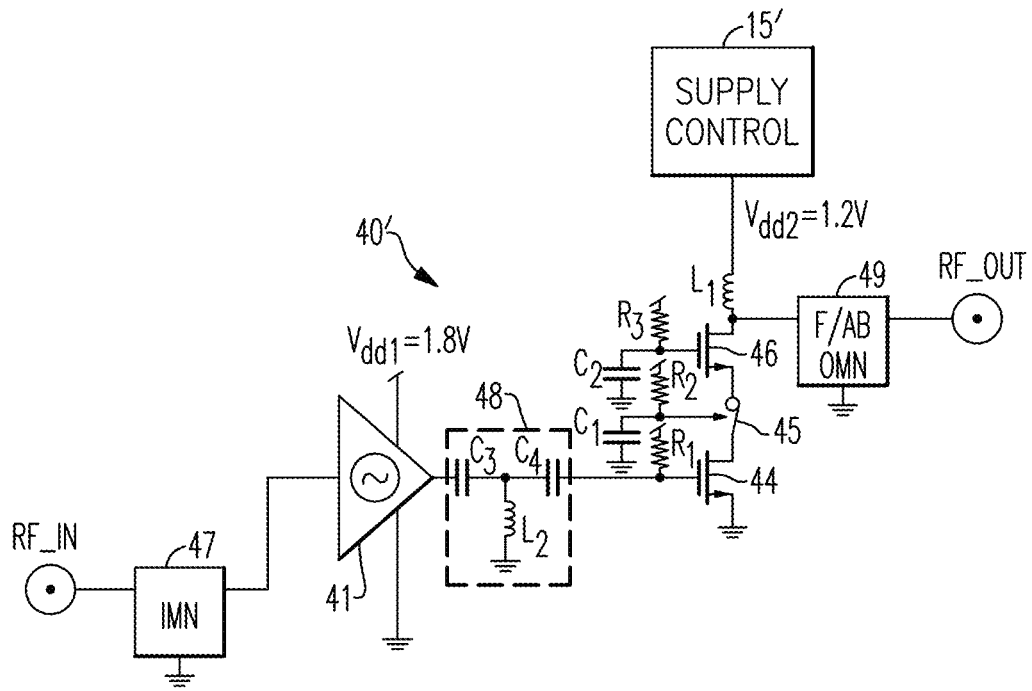
FIG. 4D is a schematic diagram of the RF amplifier of FIG. 4C with conceptual biasing illustrated for a second mode of operation of the stacked output stage.

FIG. 4D is a schematic diagram of the RF amplifier 40' of FIG. 4C with conceptual biasing illustrated for a second mode of operation of the stacked output stage.

The RF amplifier 40' of FIGS. 4C and 4D is similar to the RF amplifier 40 of FIGS. 4A and 4B, except that the RF amplifier 40' further includes a supply control circuit 15'. The supply control circuit 15' can implement any suitable features of the supply control circuit 15 of FIG. 1. In certain configurations, the supply control circuit 15' includes a DC-DC converter, such as a buck converter and/or boost converter.

Figure 5A:
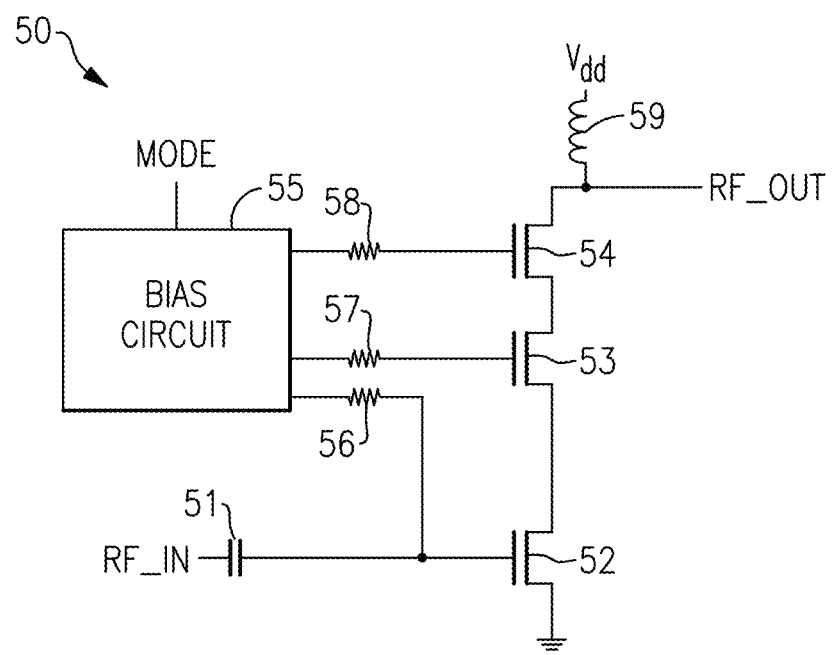
FIG. 5A is a schematic diagram of a stacked output stage and a bias circuit in a first mode according to an embodiment.

FIG. 5A is a schematic diagram of an amplification circuit 50 that includes a stacked output stage and a bias circuit in a first mode according to an embodiment. The stacked output stage can amplify an RF signal. A DC blocking capacitor 51 can provide an RF signal to an input of the stacked output stage. As illustrated, the stacked output stage includes transistors 52, 53, and 54 arranged in series with each other. The transistors 52, 53, and 54 can be silicon-on-insulator field effect transistors. The bias circuit 55 can bias the transistors of the stacked output stage. The bias circuit 55 can dynamically bias the transistors of the stacked output stage responsive to a mode control signal MODE. The stacked output stage can receive bias signals by way of biasing circuit elements 56, 57, and 58. In the first mode, the bias circuit 55 biases the transistor 53 to a linear region of operation. The stacked output stage can receive a supply voltage $V_{dd}$ by way of an inductor 59.

Figure 5B:
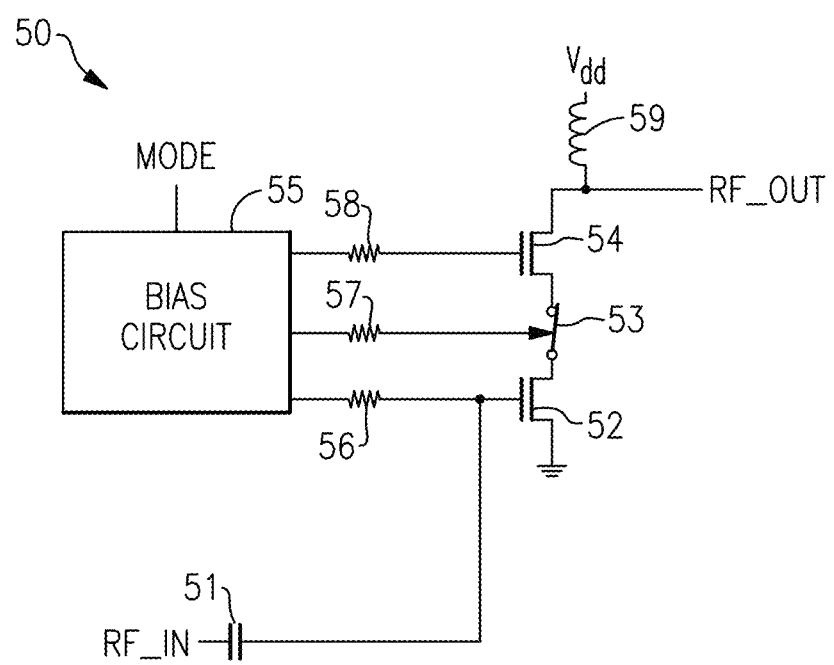
FIG. 5B is a schematic diagram of the stacked output stage and the bias circuit of FIG. 5A in a second mode according to an embodiment.

FIG. 5B is a schematic diagram of the amplification circuit 50 of FIG. 5A in a second mode according to an embodiment. The second mode can be associated with a lower power than the first mode. In the second mode of operation, the supply voltage $V_{dd}$ provided to the stacked output stage can have a higher voltage level than in the first mode. The mode control signal MODE provided to the bias circuit 55 can be at a different signal level and/or in a different state. Responsive to the mode control signal MODE, the bias circuit 55 can bias the transistor 53 as a switch. The transistor 53 can operate in a saturation region of operation in the second mode.

Figure 6A:
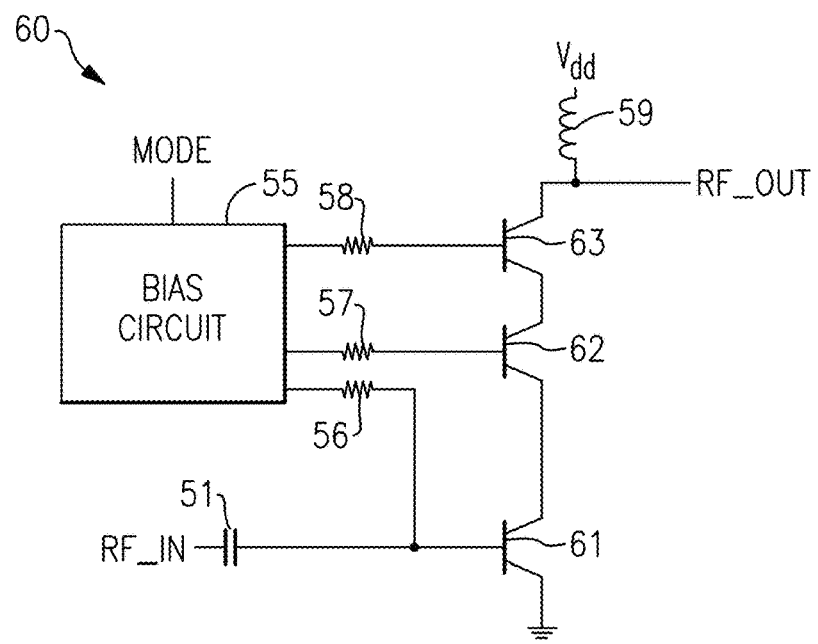
FIG. 6A is a schematic diagram of a stacked output stage with bipolar transistors and a bias circuit in a first mode according to an embodiment.

FIG. 6A is a schematic diagram of an amplification circuit 60 that includes a stacked output stage and a bias circuit in a first mode according to an embodiment. The amplification circuit 60 is like the amplification circuit 50 except the stacked output stage is implemented by bipolar transistors, or a combination of field-effect and bipolar transistors. As illustrated in FIG. 6A, the stacked output stage includes two common base transistors 62 and 63 in series with a common emitter transistor 61. The bipolar transistors illustrated in FIG. 6A can be implemented by semiconductor-on-insulator technology. Any suitable circuit topologies discussed and/or illustrated herein with field effect transistors can alternatively be implemented by bipolar transistors. According to some other embodiments, the amplification circuit 60 can include an RF impedance, such as an inductor, disposed between the bias circuit 55 and the base of the transistor 61 in place of the resistor illustrated in FIGS. 6A and 6B. Alternatively or additionally, an amplification circuit with a stacked bipolar amplifier can be implemented without resistors disposed between a bias circuit and one or more of the bipolar transistors of the stack.

Figure 6B:
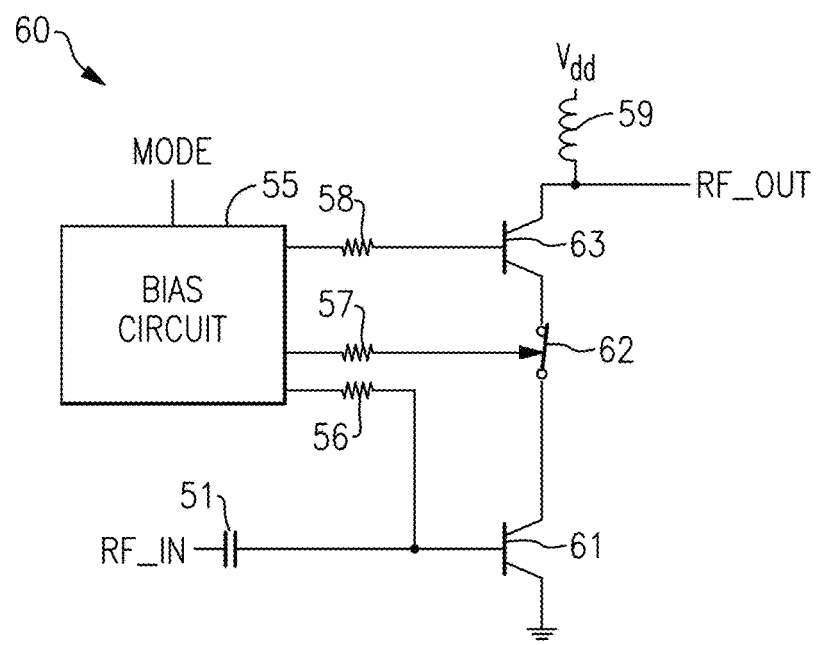
FIG. 6B is a schematic diagram of the stacked output stage and the bias circuit of FIG. 6A in a second mode according to an embodiment.

FIG. 6B is a schematic diagram of the amplification circuit 60 of FIG. 6A in a second mode according to an embodiment. In the second mode of operation, the transistor 62 is biased as a switch.

Figure 7A:
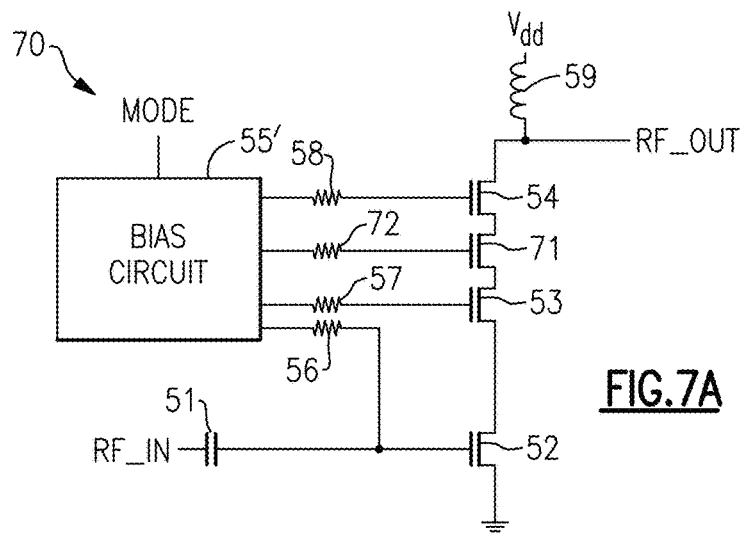
FIG. 7A is a schematic diagram of a stacked output stage with four transistors in the stack and a bias circuit in a first mode according to an embodiment.

FIG. 7A is a schematic diagram of an amplification circuit 70 that includes stacked output stage with four transistors in the stack and a bias circuit in a first mode according to an embodiment. The amplification circuit 70 is like the amplification circuit 50 except the stacked output stage is implemented by four transistors that are in series with each other. The stacked output stage illustrated in FIG. 7A includes transistors 52, 53, 71, and 54. By having an additional transistor in the stack relative to the stacked output stage shown in FIG. 5A, the stacked output stage in FIG. 7A can accommodate a larger voltage swing. The bias circuit 55' can bias the transistor 71 by way of a biasing circuit element 72. In the first mode, the transistors 53 and 71 can be biased in a linear region of operation.

Figure 7B:
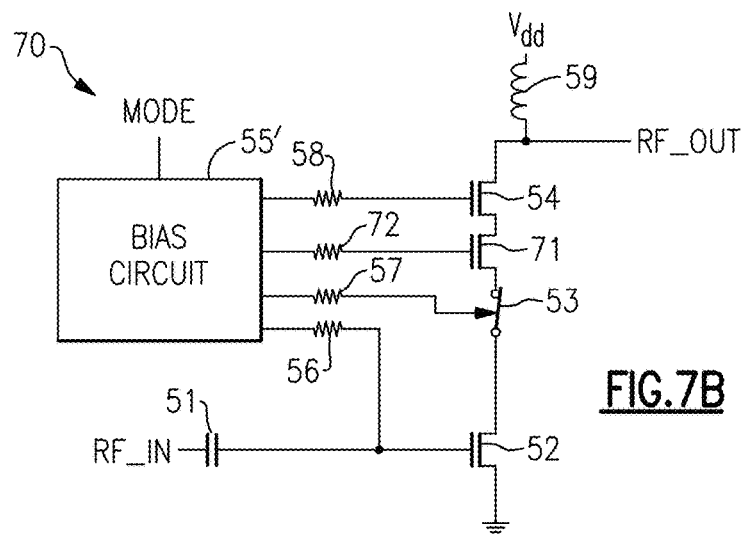
FIG. 7B is a schematic diagram of the stacked output stage and the bias circuit of FIG. 7A in a second mode according to an embodiment.
Figure 7C:
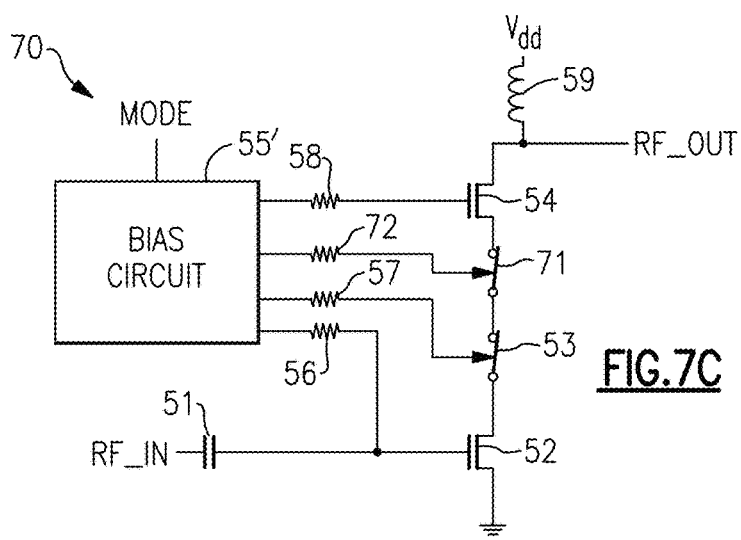
FIG. 7C is a schematic diagram of the stacked output stage and the bias circuit of FIG. 7A in a third mode according to an embodiment.

FIG. 7B is a schematic diagram of the stacked output stage and the bias circuit of FIG. 7A in a second mode according to an embodiment. FIG. 7C is a schematic diagram of the stacked output stage and the bias circuit of FIG. 7A in a third mode according to an embodiment. As shown in FIG. 7B, the transistor 53 can be biased as a switch in the second mode. The stacked output stage of FIG. 7B can behave like a triple stack when the transistor 53 is biased as a switch and the other transistors of the stack are biased as gain stages. As shown in FIG. 7C the transistors 53 and 71 can be biased as switches in a third mode. The stacked output stage of FIG. 7C can behave like a double stack when the transistors 53 and 71 are biased as switches and the other transistors of the stack are biased as gain stages. Accordingly, the bias circuit 55' can bias the stacked output stage of FIGS. 7A to 7C to behave as if two, three, or four transistors are in the stack. The principles and advantages discussed herein can also be applied to stacked output stages having five or more transistors in series with each other.

Figure 8A:
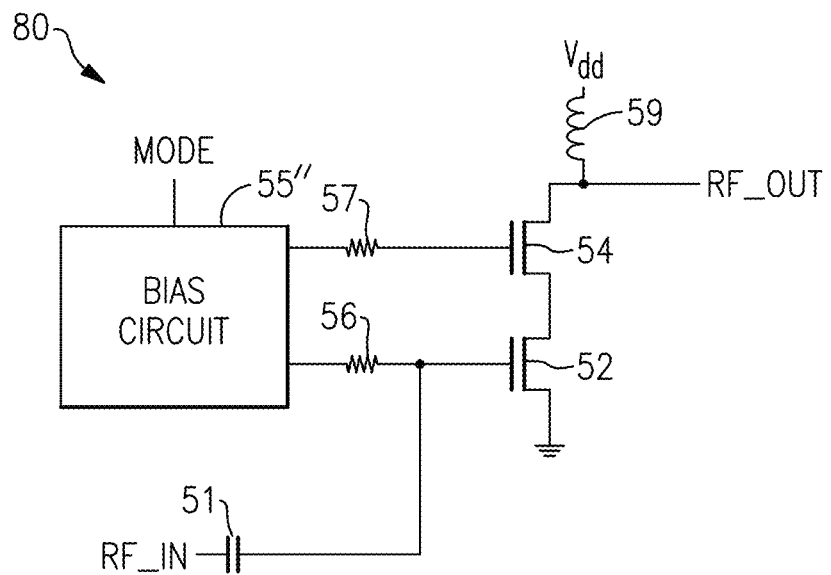
FIG. 8A is a schematic diagram of a stacked output stage with two transistors in the stack and a bias circuit in a first mode according to an embodiment.

FIG. 8A is a schematic diagram of an amplification circuit 80 that includes a stacked output stage with two transistors in the stack and a bias circuit in a first mode according to an embodiment. The amplification circuit 80 is like the amplification circuit 50 except that the stacked output stage is implemented by two transistors that are in series with each other. As shown in FIG. 8A, the bias circuit 55" can bias the transistor 53 to a linear region of operation in the first mode.

Figure 8B:
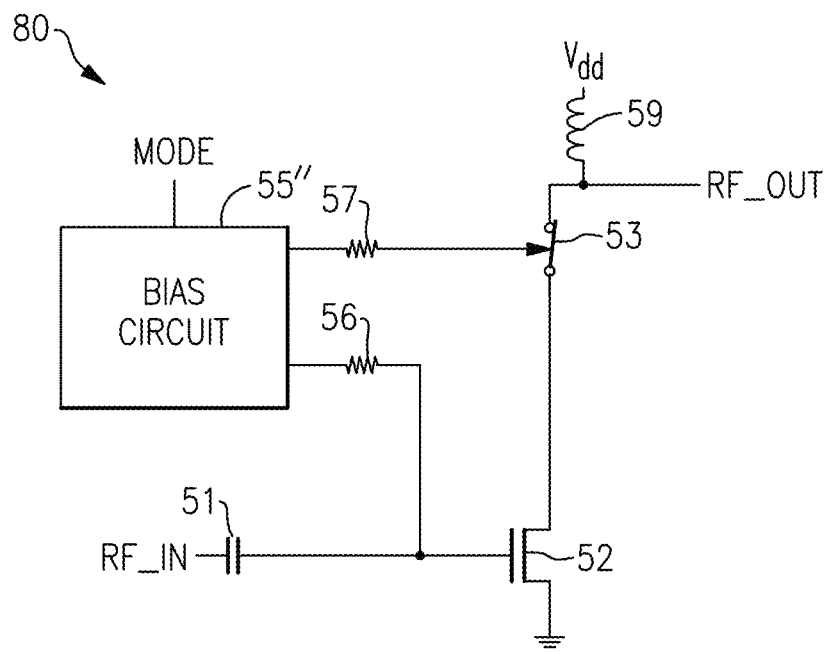
FIG. 8B is a schematic diagram of the stacked output stage and the bias circuit of FIG. 8A in a second mode according to an embodiment.

FIG. 8B is a schematic diagram of the amplification circuit 80 of FIG. 8A in a second mode according to an embodiment. As shown in FIG. 8A, the bias circuit 55" can bias the transistor 53 in as a switch in the second mode.

Figure 9A:
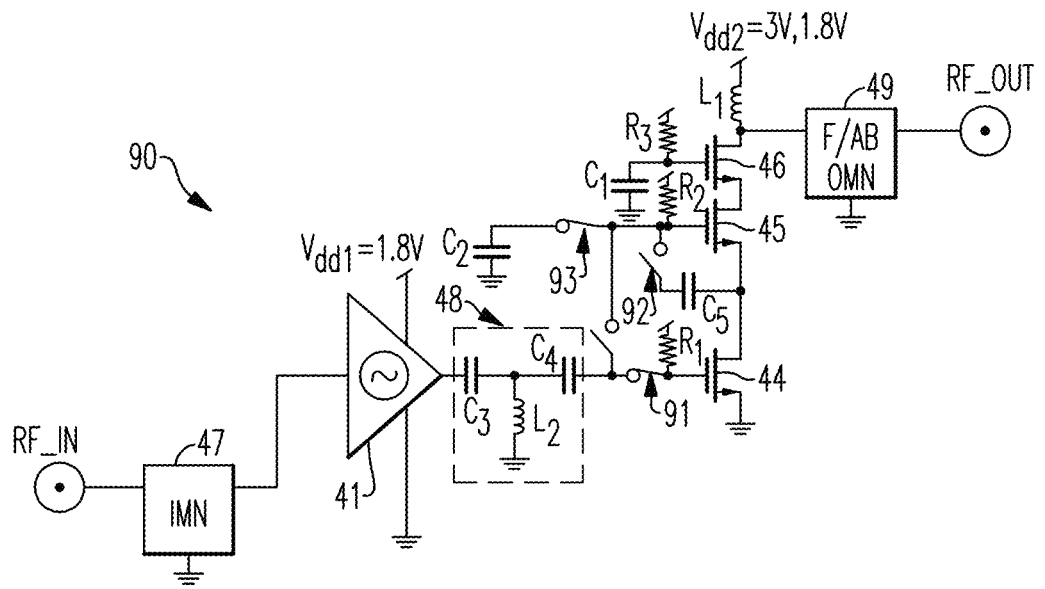
FIG. 9A is a schematic diagram of another embodiment of an RF amplifier with conceptual biasing illustrated for a first mode of operation of a stacked output stage.
Figure 9B:
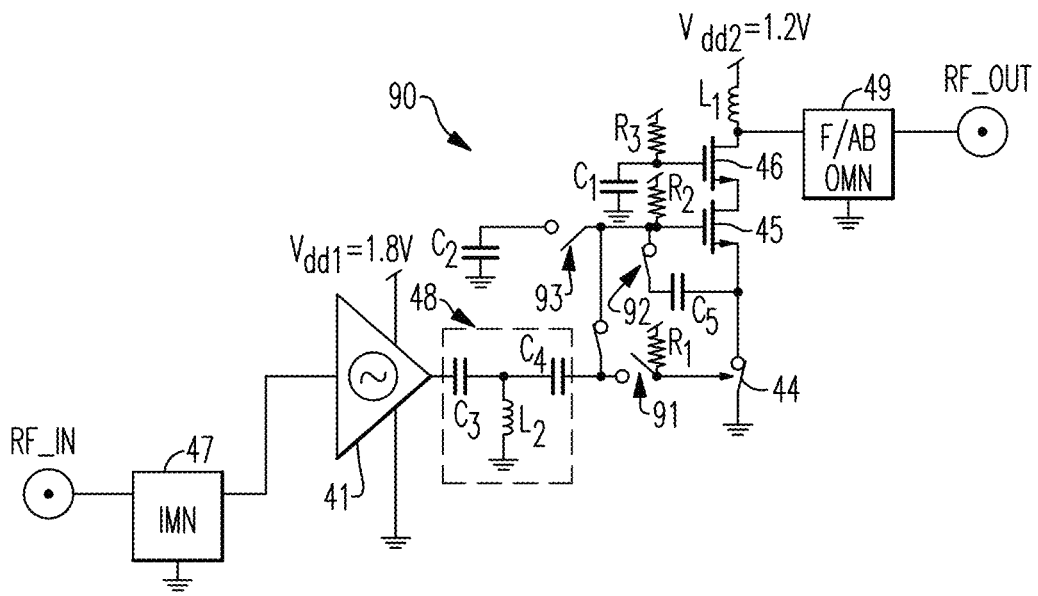
FIG. 9B is a schematic diagram of the RF amplifier of FIG. 9A with conceptual biasing illustrated for a second mode of operation of the stacked output stage.

FIG. 9A is a schematic diagram of another embodiment of an RF amplifier 90 with conceptual biasing illustrated for a first mode of operation of a stacked output stage. FIG. 9B is a schematic diagram of the RF amplifier 90 of FIG. 9A with conceptual biasing illustrated for a second mode of operation of the stacked output stage.

The RF amplifier 90 of FIGS. 9A-9B is similar to the RF amplifier 40 of FIGS. 4A-4B, except that additional switches 91, 92, and 93 are included and a different transistor in the stack can be biased as a switch in a mode associated with a lower output stage supply voltage. Any suitable control circuit can control the switches 91, 92, and 93. In the RF amplifier 90, the transistor 44 can be biased to operate as a common source amplifier as shown in FIG. 9A or as a switch as shown in FIG. 9B.

The switch 91 can selectively electrically couple an output of the injection-locked oscillator driver stage 41 to different transistors of the output stage in different modes of operation. The switch 91 can provide an RF input signal for the output stage to the transistor 44 in as shown in FIG. 9A. The switch 91 can provide the RF input signal to the output stage to the transistor 45 in a different mode as shown in FIG. 9B. The switch 91 can be a multi-throw switch, such as a single pole double throw (SPDT) switch.

The switch 92 can maintain an RF inter-stage match as the mode changes. In the illustrated embodiment, the switch 92 can electrically couple a capacitor $C_5$ to the gate of the transistor 45 to maintain the RF inter-stage match when the transistor 44 is biased as a switch as shown in FIG. 9B. When the transistor 45 is biased as a common gate amplifier as shown in FIG. 9A, the switch 92 can electrically disconnect the capacitor $C_5$ from the gate of the transistor 45.

The switch 93 can electrically connects AC grounding gate capacitor $C_2$ to the gate of transistor 45 when the transistor 45 is configured as a common gate amplifier as shown in FIG. 9A. The switch 93 can disconnect AC grounding gate capacitor $C_2$ from the gate of transistor 45 when the transistor 45 is configured as a common source amplifier as shown in FIG. 9B.

Any suitable combination of features of the RF amplifier 40 and the RF amplifier 90 can be implemented together with each other. The power amplifier 12 of FIG. 1 can be implemented in accordance with any of the principles and advantages of the RF amplifier 90. The RF amplifier 90 can be implemented in accordance with any of the principles and advantages discussed herein.

Figure 10:
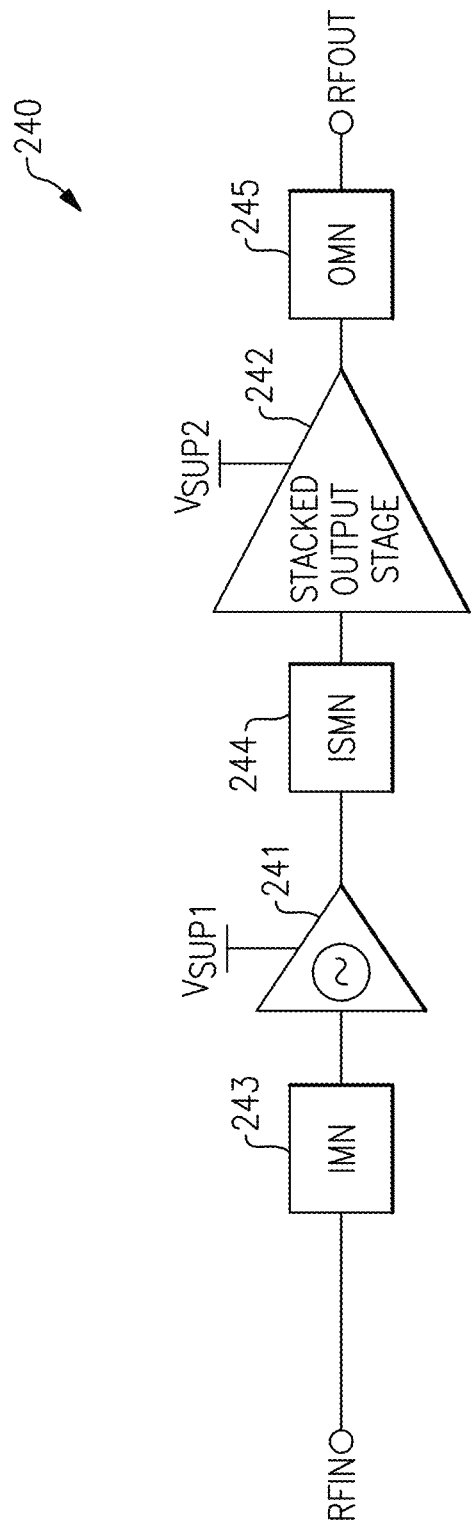
FIG. 10 is a schematic diagram of another embodiment of an RF amplifier with an injection-locked oscillator driver stage and a stacked output stage.

FIG. 10 is a schematic diagram of another embodiment of an RF amplifier 240 with an injection-locked oscillator driver stage and a stacked output stage. The RF amplifier 240 includes an injection-locked oscillator driver stage 241, a stacked output stage 242, an input matching network 243, an interstage matching network 244, and an output matching network 245.

The injection-locked oscillator driver stage 241 is powered by a first supply voltage $V_{SUP1}$, and the stacked output stage 242 is powered by a second supply voltage $V_{SUP2}$. The driver stage 241 receives an RF input signal RFIN via the input matching network 243, and generates an amplified RF signal, which is injection-locked. The output stage 242 receives the amplified RF signal via the interstage matching network 244, and further amplifies the amplified RF signal to generate an RF output signal RFOUT.

Figure 11A:
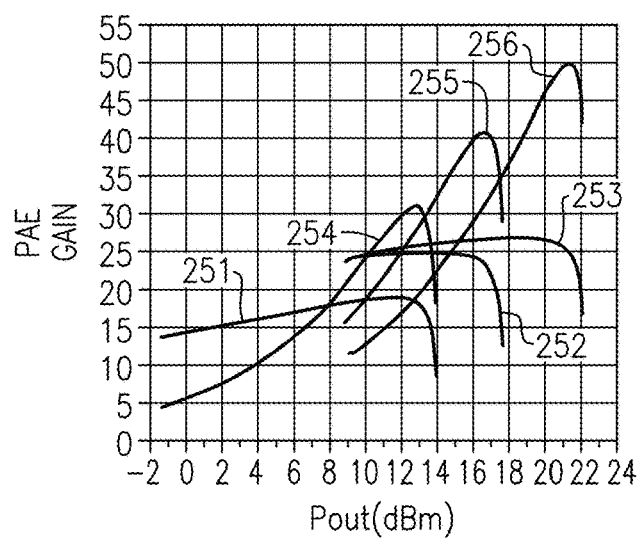
FIGS. 11A, 11B, and 11C show graphs of simulation results for one example of a radio frequency amplifier with an input stage and an output stage each implemented using a common source stage.
Figure 11B:
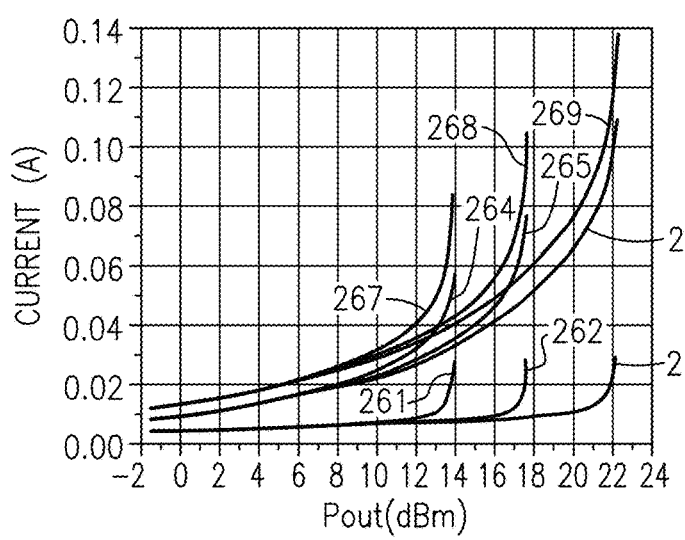
Figure 11C:
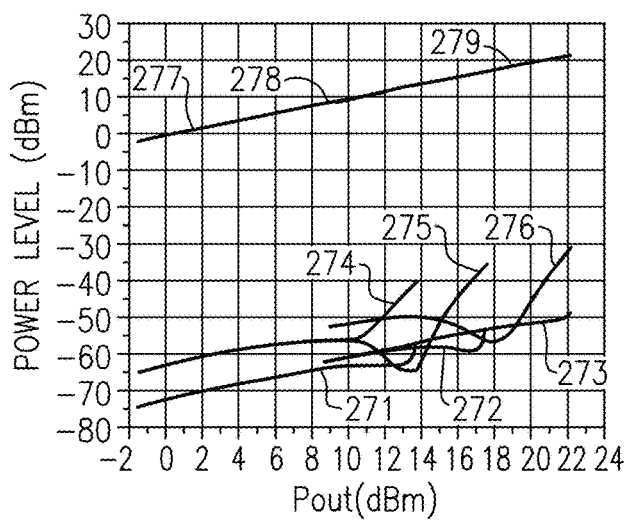

FIGS. 11A-11C show graphs of simulation results for one example of a radio frequency amplifier with an input stage and an output stage each implemented using a common source stage. The input common source stage is powered by a first supply voltage $V_{SUP1}$ and the output common source stage is powered by a second supply voltage $V_{SUP2}$. The graphs include simulation results in a low power mode (13-dBm) in which $V_{SUP1}$ is 1.8 V and $V_{SUP2}$ is 1.2 V, a medium power mode (16-dBm) in which $V_{SUP1}$ is 1.8 V and $V_{SUP2}$ is 1.8 V, and a high power mode (21-dBm) in which $V_{SUP1}$ is 1.8 V and $V_{SUP2}$ is 3.0 V.

FIG. 11A shows a graph 250 of power added efficiency (PAE) and gain versus output power. The graph 250 includes a first gain plot 251 for the low power mode, a second gain plot 252 for the medium power mode, and a third gain plot 253 for the high power mode. Additionally, the graph 250 includes a first PAE plot 254 for the low power mode, a second PAE plot 255 for the medium power mode, and a third PAE plot 256 for the high power mode.

FIG. 11B shows a graph 260 of current consumption versus output power. The graph 260 includes a first driver stage current consumption plot 261 for the low power mode, a second driver stage current consumption plot 262 for the medium power mode, and a third driver stage current consumption plot 263 for the high power mode. Additionally, the graph 260 includes a first output stage current consumption plot 264 for the low power mode, a second output stage current consumption plot 265 for the medium power mode, and a third output stage current consumption plot 266 for the high power mode. Furthermore, the graph 260 includes a first total current consumption plot 267 for the low power mode, a second total current consumption plot 268 for the medium power mode, and a third total current consumption plot 269 for the high power mode.

As shown in FIG. 11B, the relatively comparable current consumption of the driver stage to that of the output stage in the low power mode leads to a relatively large impact on overall efficiency. Moreover, since the supply voltage of the output stage decreases to about 33% below that of the driver stage in this example, the output stage saturates at a lower output power level and consequently, both power gain and current consumption of the driver stage have a relatively large impact on overall efficiency. Accordingly, relying on a very efficient driver stage is crucial for an overall efficient operation in the low power mode.

FIG. 11C shows a graph 270 of power level versus output power. The graph 270 includes a second harmonic frequency power plot 271 for the low power mode, a second harmonic frequency power plot 272 for the medium power mode, and a second harmonic frequency power plot 273 for the high power mode. Additionally, the graph 270 includes a third harmonic frequency power plot 274 for the low power mode, a third harmonic frequency power plot 275 for the medium power mode, and a third harmonic frequency power plot 276 for the high power mode. Furthermore, the graph 270 includes a fundamental frequency power plot 277 for the low power mode, a fundamental frequency power plot 278 for the medium power mode, and a fundamental frequency power plot 279 for the high power mode.

In certain configurations herein, an RF amplifier includes an injection-locked oscillator driver stage and a stacked output stage having an adjustable supply voltage that changes with a mode of the RF amplifier. By implementing the RF amplifier in this manner, the RF amplifier exhibits excellent efficiency, including in a low power mode. For example, in the low power mode, the adjustable supply voltage used to power the stacked output stage is decreased, and the driver stage has a relatively large impact on overall efficiency of the RF amplifier. By implementing the driver stage using an injection-locked oscillator, the overall efficiency of the RF amplifier is relatively high across different modes.

An RF system can include a separate amplifier die to provide transistors having higher efficiency and/or higher breakdown voltages. For example, an RF system can use a Gallium Arsenide (GaAs) die, a Gallium Nitride (GaN) die, or a Silicon Germanium (SiGe) die in which high impedance loadline provides relatively high voltage swing and relatively low current consumption. However, using a separate amplifier die can increase the cost of the RF system and/or impact performance of other components of the RF system. For example, it may be desirable to implement the RF amplifier in SOI technologies, since RF switches and/or low noise amplifiers (LNAs) can exhibit superior performance when implemented using SOI processes relative to other technologies.

In certain configurations herein, an RF front end integrated circuit (FEIC) is provided. The RF FEIC is fabricated using an SOI process, and includes at least one LNA, at least one RF switch, and at least one RF amplifier, such as a power amplifier. By integrating the RF amplifier with the LNA and/or switch, overall cost is reduced. Moreover, the LNA and/or RF switch exhibit superior performance relative to configurations in which the LNA and/or RF switch are fabricated using other processes. The RF amplifier can be implemented as a power amplifier, and integrated with the LNA and switch to provide a front end for an RF transceiver on a single chip.

Using an injection-locked oscillator as a driver stage can provide a number of benefits relative to a single-stage amplifier that uses an injection-locked oscillator. For example, an injection-locked oscillator includes an inductor-capacitor (LC) resonator or tank that is injection-locked to an input signal. When the supply voltage of an injection-locked oscillator is changed with operating mode, the injection-locked oscillator can be detuned. For example, a change to the supply voltage can shift the center frequency of oscillation and/or change the range of frequencies that the oscillator can be injection-locked to and, in turn, making susceptible to undesired modes of operation such as quasi-lock or fast-beat modes. Accordingly, using an injection-locked oscillator driver stage with a constant supply voltage in combination with a variable supply voltage output stage provides robust performance relative to a single-stage amplifier that uses an injection-locked oscillator.

Figure 12:
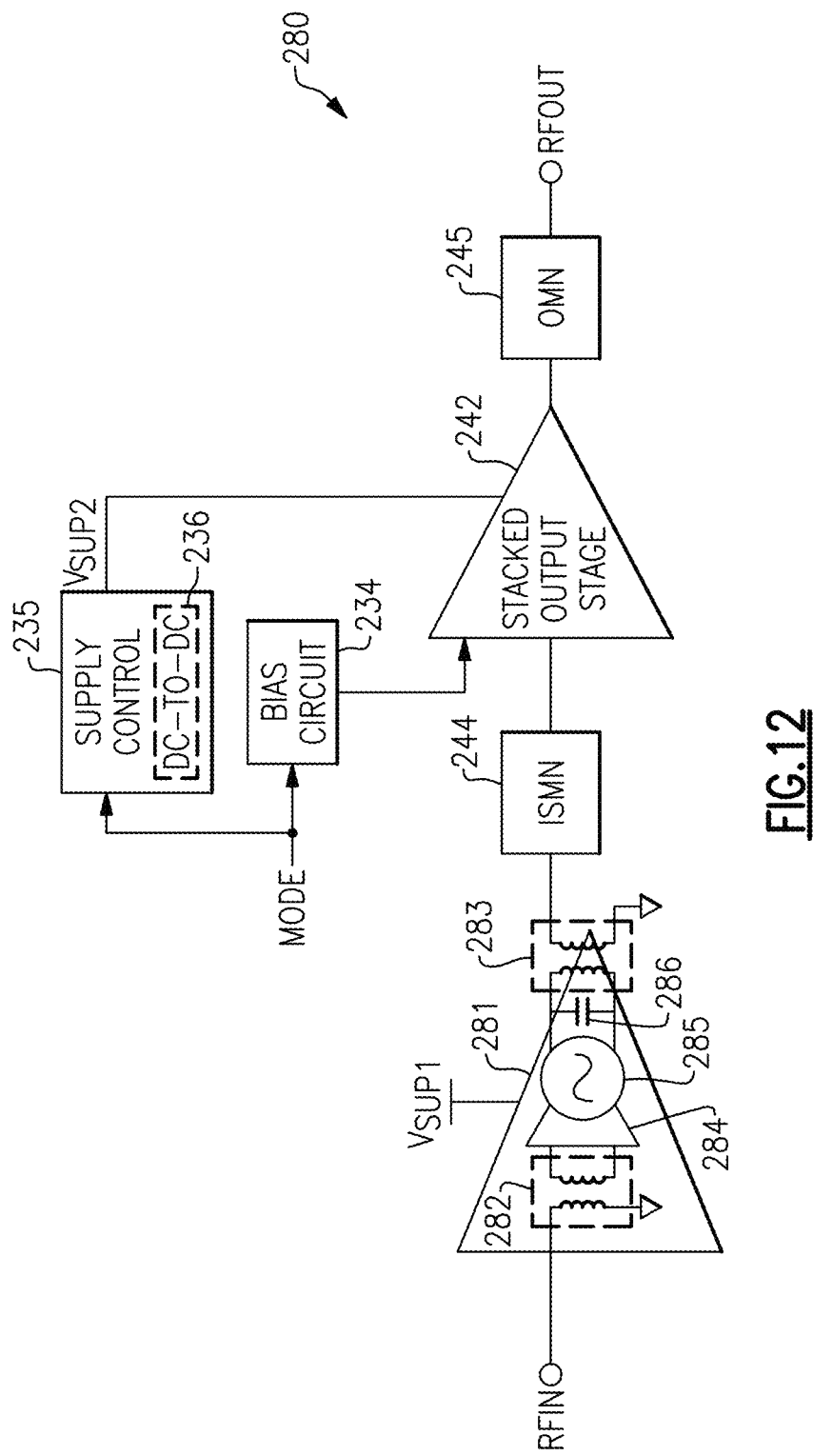
FIG. 12 is a schematic diagram of another embodiment of an RF amplifier with an injection-locked oscillator driver stage and a stacked output stage.

FIG. 12 is a schematic diagram of an RF amplifier 280 according to one embodiment. The RF amplifier 280 includes a bias circuit 234, a supply control circuit 235, an injection-locked oscillator driver stage 281, a stacked output stage 242, an interstage matching network 244, an output matching network 245.

The injection-locked oscillator driver stage 281 is powered by a first supply voltage $V_{SUP1}$, and the stacked output stage 242 is powered by a second supply voltage $V_{SUP2}$, which is received from the supply control circuit 235. In the illustrated embodiment, the supply control circuit 235 includes a DC-to-DC converter 236.

The injection-locked oscillator driver stage 281 receives an RF input signal RFIN, and generates an amplified RF signal. The stacked output stage 242 receives the amplified RF signal via the interstage matching network 244, and further amplifies the amplified RF signal to generate an RF output signal RFOUT.

Although the illustrated embodiment includes two stages, the RF amplifier 280 can include additional stages. For example, the RF amplifier can include a preceding stage before the injection-locked oscillator driver stage 281 and/or an additional stage can be included between the injection-locked oscillator driver stage 281 and the stacked output stage 242.

As shown in FIG. 12, the injection-locked oscillator driver stage 281 includes an input transformer or balun 282, an output transformer or balun 283, a signal injecting circuit 284, and a negative transconductance circuit 285. The injection-locked oscillator driver stage 281 further includes a capacitor 286, which operates with an inductance of the output transformer 283 in an LC tank or resonator. In certain implementations, the capacitor 286 includes one or more parasitic capacitances, such as parasitic diffusion capacitances of transistors of the negative transconductance circuit 285.

The negative transconductance circuit 285 provides energy to maintain the LC tank in resonance. When injection-locked, the LC tank can oscillate at a frequency substantially equal to the frequency of the RF input signal RFIN. The output transformer 283 serves to convert a differential signal of the LC tank resonator to a single-ended signal suitable for driving the input to the stacked output stage 242. Configuring the injection-locked oscillator driver stage 281 to provide differential to single-ended signal conversion at the inter-stage reference plane reduces or eliminates the impact of output balun loss on overall amplifier efficiency in a fully differential stacked output stage architecture scenario.

The injection-locked oscillator driver stage 281 operates with very low power consumption relative to driver stages implemented as a common source or common emitter amplifier. During operation, the injection-locked oscillator driver stage 281 is locked in frequency and phase with respect to the radio frequency input signal RFIN. In certain configurations, the RF input signal RFIN is a modulated signal having a substantial constant signal envelope.

In the illustrated embodiment, the first supply voltage $V_{SUP1}$ operates with a substantially constant voltage level across operating modes of the RF amplifier 280. Thus, when the mode of the RF amplifier 280 changes, the oscillation center frequency and associated locking range of the injection-locked oscillator driver stage 281 remains substantially unchanged. Configuring the RF amplifier 280 provides robust performance across different operating modes.

In contrast, an RF amplifier using an injection-locked oscillator in an output stage can become detuned in response to supply voltage changes. For example, the oscillation center frequency and/or tuning range of such an injection-locked oscillator can change in different power modes, thereby degrading performance.

The illustrated injection-locked oscillator driver stage 241 provides a differential-to-single-ended signal conversion operation prior to amplification by the stacked output stage 242. In contrast, certain power amplifies provide such a conversion at the output of the power amplifier's driver stage. By implementing the differential-to-singled-ended conversion in the injection-locked oscillator driver stage 281, superior power efficiency performance can be achieved. In particular, performing the conversion at a lower signal power level provides higher efficiency relative to performing the conversion at a higher signal power level. For instance, a loss of L dB due to signal conversion has a larger impact at the output of the stacked output stage 242 relative to the same amount of loss at the input of the stacked output stage 242.

The stacked output stage 242 can be implemented in a variety of ways. In a first example, the stacked output stage 242 is implemented as a cascode amplifier including a stack of two or more NMOS transistors, and the input signal is provided to a gate of the bottommost transistor in the stack and the output signal is provided from a drain of the uppermost transistor in the stack. In certain implementations, the bias circuit 234 is included to bias one or more transistors of the stack based on the mode control signal MODE, as was discussed earlier.

The interstage matching network 244 provides impedance matching between the output of the driver stage 281 and an input to the stacked output stage 242. Additionally, the output matching network 245 provides output impedance matching to the stacked output stage 242. In certain implementations, the interstage matching network 244 and/or the output matching network 245 provide harmonic termination, DC biasing, and/or aid in achieved a desired loadline impedance. Including the interstage matching network 244 and the output matching network 245 increase power transfer relative to a configuration in which the impedance matching networks are omitted. The impedance matching networks can be implemented in a wide variety of ways.

Additional details of the multi-stage amplifier 280 can be as described herein.

Figure 13:
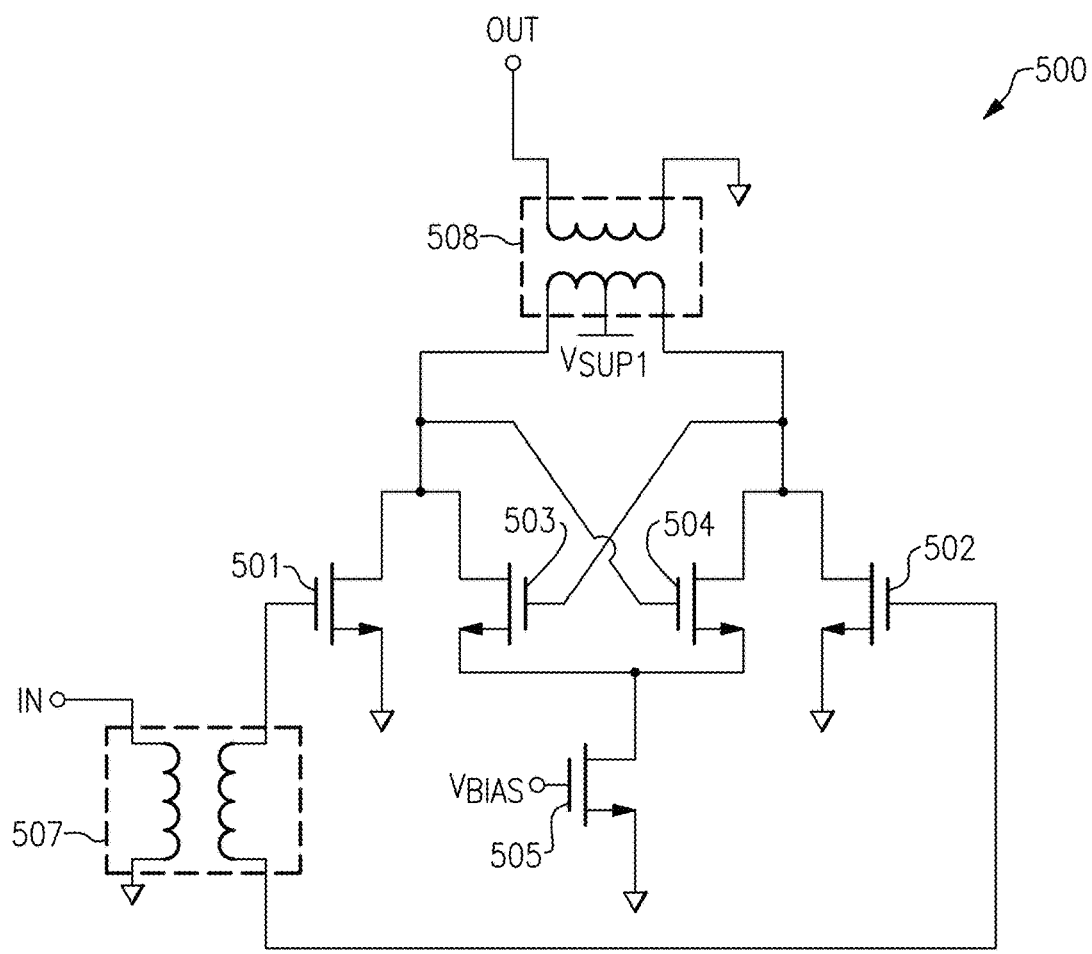
FIG. 13 is a schematic diagram of an injection-locked oscillator driver stage according to one embodiment.

FIG. 13 is a schematic diagram of an injection-locked oscillator driver stage 500 according to one embodiment. The injection-locked oscillator driver stage 500 includes an input transformer or balun 507, an output transformer or balun 508, a first signal injecting n-type metal-oxide-semiconductor (NMOS) transistor 501, a second signal injecting NMOS transistor 502, a first negative transconductance NMOS transistor 503, a second negative transconductance NMOS transistor 504, and a bias NMOS transistor 505.

As shown in FIG. 13, the injection-locked oscillator driver stage 500 receives a single-ended RF input signal IN and generates a single-ended RF output signal OUT. Additionally, the injection-locked oscillator driver stage 500 is powered using the first supply voltage $V_{SUP1}$. In the illustrated embodiment, the first supply voltage $V_{SUP1}$ is provided to a center tap of a first winding of the output transformer 508.

The first and second negative transconductance NMOS transistors 503, 504 are cross-coupled with one another, and operate as a negative transconductance circuit. The first winding of the output transformer 508 is electrically connected between the drain of the first negative transconductance NMOS transistor 503 and the drain of the second negative transconductance NMOS transistor 504. The output transformer 508 serves to convert a differential-ended signal corresponding to a voltage difference between the drains of the negative transconductance NMOS transistors 503, 504 to the single-ended RF output signal OUT. In the illustrated embodiment, the singled-ended RF output signal OUT is generated by a second winding of the output transformer 508, and is referenced to a ground voltage.

The injection-locked oscillator driver stage 500 includes an LC tank associated with the inductance of the output transformer 508 and a parasitic capacitance at the drains of the negative transconductance NMOS transistors 503, 504. The bias NMOS transistor 505 controls a bias current of the negative transconductance NMOS transistors 503, 504 and the LC tank's oscillation amplitude.

In the illustrated embodiment, the gate of the bias NMOS transistor 505 receives a bias voltage $V_{BIAS}$, which controls the amount of bias current of the negative transconductance NMOS transistors 503, 504. In certain implementations, the bias voltage $V_{BIAS}$ is controllable, such as by digital programming via an IC interface. The bias voltage $V_{BIAS}$ can be provided to the gate of the bias NMOS transistor 505 through a resistive feed to aid in providing isolation to circuitry that generates the bias voltage $V_{BIAS}$.

The negative transconductance NMOS transistors 503, 504 provide energy to the LC tank to maintain oscillations. When the input signal IN is not present, the oscillation frequency of the LC tank resonator can correspond to the LC tank's resonant frequency.

The input transformer 507 serves to convert the single-ended RF input signal IN to a differential signal provided to the gates of the signal injecting NMOS transistors 501, 502. As shown in FIG. 13, the drains of the first and second signal injecting NMOS transistors 501, 502 are electrically connected to the drains of the first and second negative transconductance NMOS transistors 503, 504, respectively. When the RF input signal IN is sufficiently large, the signal injecting NMOS transistors 501, 502 provide sufficient signal injection to lock the oscillation frequency and phase of the LC oscillator to the frequency of the RF input signal IN.

The injection-locked oscillator driver stage 500 illustrates one embodiment of an injection-locked driver stage that can be used in the RF amplifiers described herein. However, an injection-locked oscillator driver stage can be implemented in other ways.

Additional details of the injection-locked oscillator driver stage 500 can be as described herein.

Examples of Electronic Systems including Radio Frequency Amplifiers

An RF amplifier can be integrated on a semiconductor die, which in turn can be included in a wide variety of electronic systems.

Figure 14A:
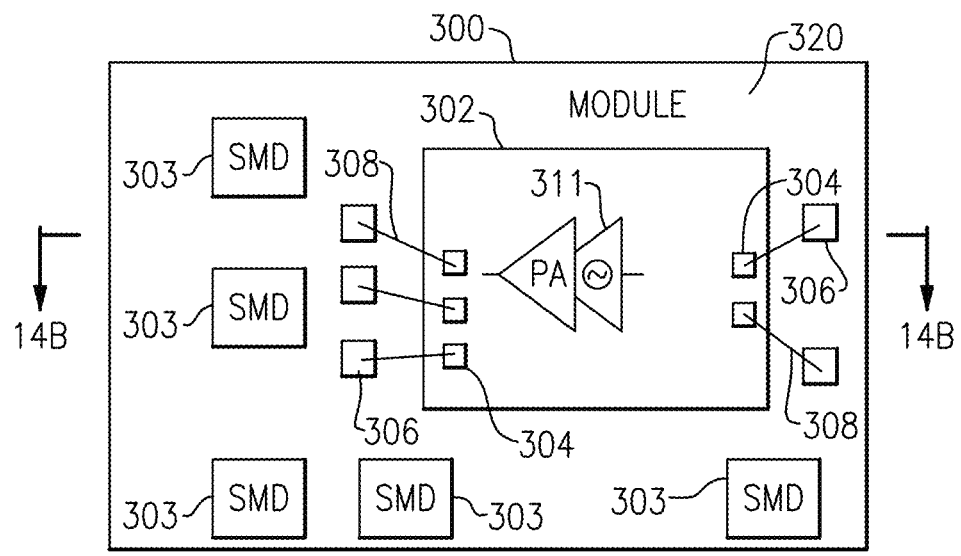
FIG. 14A is a schematic diagram of one embodiment of a packaged module.
Figure 14B:
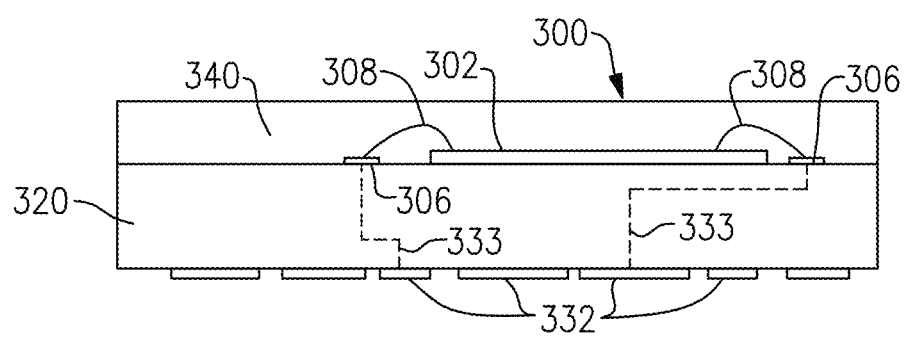
FIG. 14B is a schematic diagram of a cross-section of the packaged module of FIG. 14A taken along the lines 14B-14B.

FIG. 14A is a schematic diagram of one embodiment of a packaged module 300. FIG. 14B is a schematic diagram of a cross-section of the packaged module 300 of FIG. 14A taken along the lines 14B-14B.

The packaged module 300 includes a semiconductor die 302, surface mount devices (SMDs) 303, wirebonds 308, a package substrate 320, and an encapsulation structure 340. The package substrate 320 includes pads 306 formed from conductors disposed therein. Additionally, the semiconductor die 302 includes pins or pads 304, and the wirebonds 308 have been used to connect the pads 304 of the die 302 to the pads 306 of the package substrate 320.

The semiconductor die 302 includes a power amplifier 311 implemented in accordance with one or more features of the present disclosure. In certain implementations, the semiconductor die 302 further includes an LNA and switches such that the packaged module 300 operates as a front-end module.

The packaging substrate 320 can be configured to receive a plurality of components such as the semiconductor die 302 and the surface mount devices 303, which can include, for example, surface mount capacitors and/or inductors.

In certain implementations, one or more of the surface mount devices 303 operate in an output matching network (OMN) for the power amplifier 311.

As shown in FIG. 14B, the packaged module 300 is shown to include a plurality of contact pads 332 disposed on the side of the packaged module 300 opposite the side used to mount the semiconductor die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 302 and/or the surface mount devices 303. As shown in FIG. 14B, the electrical connections between the contact pads 332 and the semiconductor die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 15:
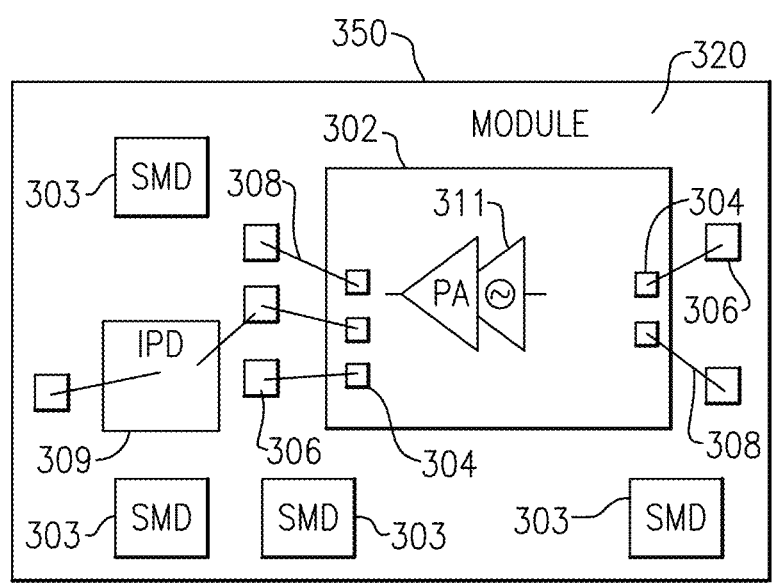
FIG. 15 is a schematic diagram of another embodiment of a packaged module.

FIG. 15 is a schematic diagram of another embodiment of a packaged module 350. The packaged module 350 of FIG. 15 is similar to the packaged module 300 of FIGS. 14A-14B, except that the packaged module 350 of FIG. 15 further includes an integrated passive device (IPD) 309. The IPD 309 can be used to provide high quality-factor (Q-factor) and/or high performance passive components.

In certain implementations, the IPD 309 operates in an OMN for the power amplifier 311.

Figure 16A:
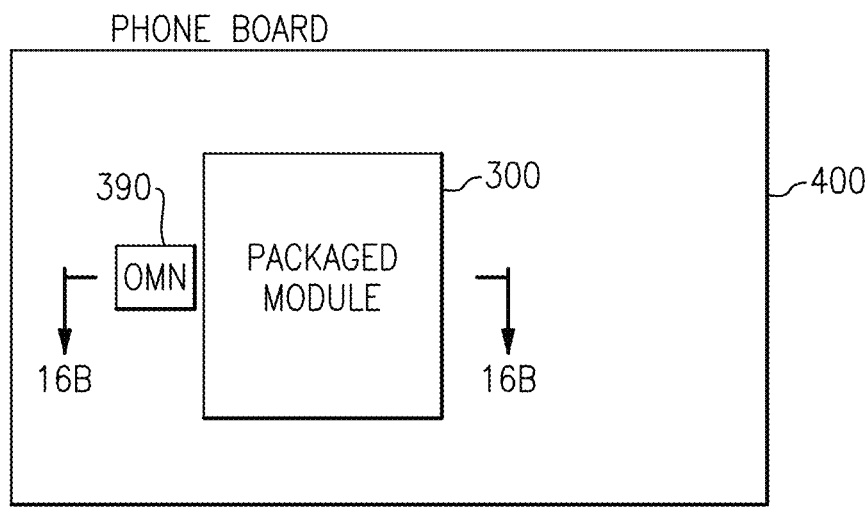
FIG. 16A is a schematic diagram of one embodiment of a phone board.
Figure 16B:
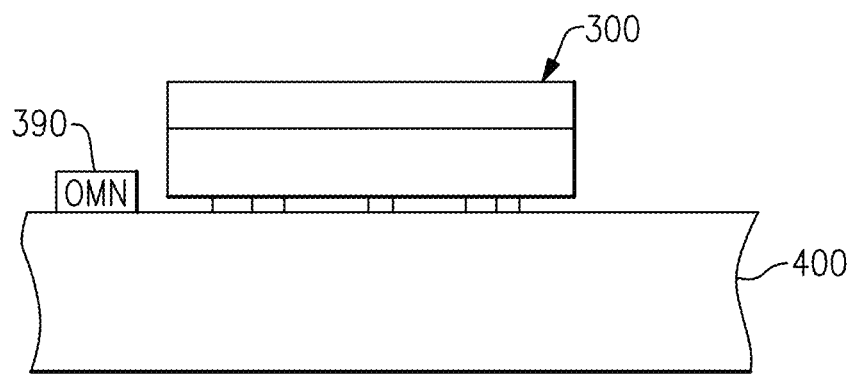
FIG. 16B is a schematic diagram of a cross-section of the phone board of FIG. 16A taken along the lines 16B-16B.

FIG. 16A is a schematic diagram of one embodiment of a phone board 400. FIG. 16B is a schematic diagram of a cross-section of the phone board 400 of FIG. 16A taken along the lines 16B-16B.

As shown in FIGS. 16A and 16B, the phone board 400 includes the packaged module 300 attached thereto. Connecting the packaged module 300 in this manner facilitates communication with other electronics on the phone board 400.

In the illustrated phone board 400 includes OMN components 390 attached to the phone board 400. In certain implementations, all of part of an OMN for a power amplifier is implemented on a phone board.

Figure 17A:
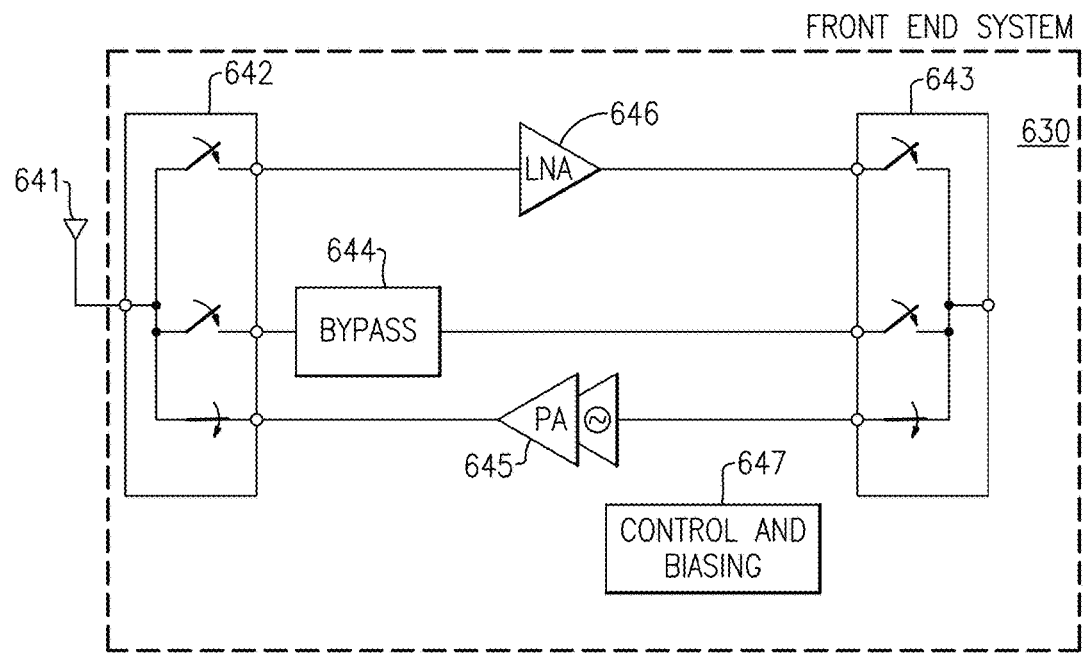
FIG. 17A is a schematic diagram of a front end system according to one embodiment.
Figure 17B:
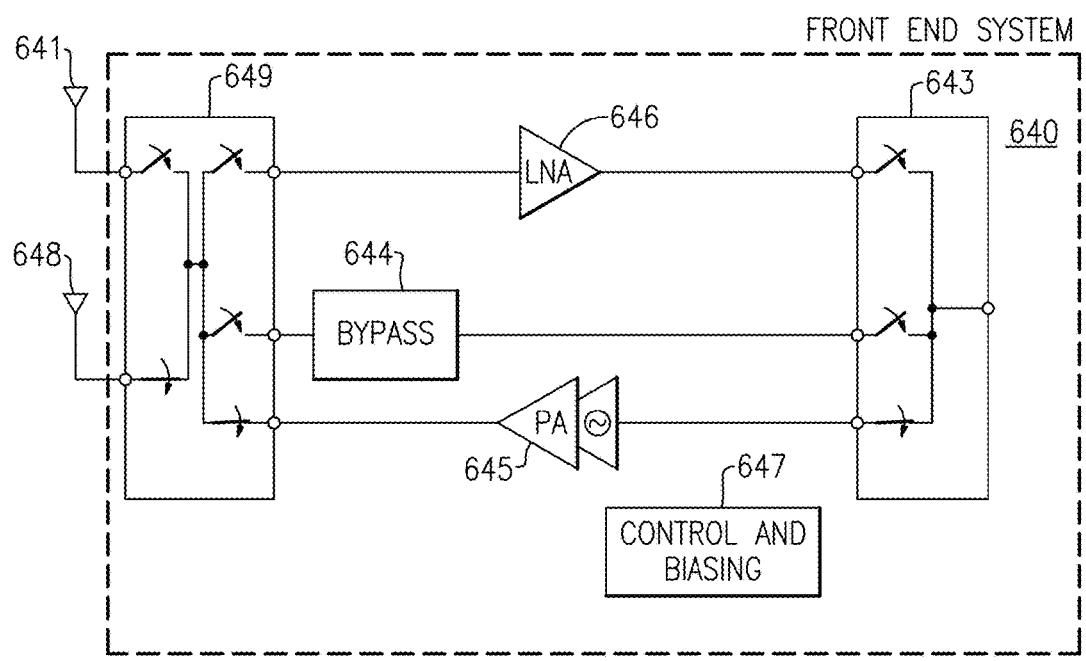
FIG. 17B is a schematic diagram of a front end system according to another embodiment.

FIG. 17A is a schematic diagram of a front end system 630 according to one embodiment. FIG. 17B is a schematic diagram of a front end system 640 according to another embodiment.

An RF front end system can include circuits in a signal path between an antennas and a baseband system. Some RF front ends can include circuits in signal paths between one or more antennas and a mixer configured to modulate a signal to RF or to demodulate an RF signal.

The front end systems of 17A and 17B can be implemented in a packaged module. Such packaged modules can include relatively low cost laminate based front end modules that combine power amplifiers with low noise amplifiers and/or switch functions. Some such packaged modules can be multi-chip modules. In certain implementations, some or the all of the illustrated components in any of the front end systems in FIGS. 17A and/or 17B can be embodied on a single integrated circuit or die. Such a die can be manufactured using any suitable process technology. As one example, the die can be a semiconductor-on-insulator die, such as a silicon-on-insulator (SOI) die. According to some implementations, one or more antennas can be integrated with any of the front end systems discussed herein.

With reference to FIG. 17A, the RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 646, a bypass signal path that includes a bypass network 644, and a transmit signal path that includes a power amplifier 645. The low noise amplifier 646 can be implemented by any suitable low noise amplifier. The bypass network 644 can include any suitable network for matching and/or bypassing the receive signal path and the transmit signal path. The bypass network 644 can be implemented by a passive impedance network or by a conductive trace or wire. The power amplifier 645 includes an injection-locked oscillator driver stage and a stacked output stage. The power amplifier 645 can be implemented in accordance with any of the principles and advantages discussed herein.

The first multi-throw switch 642 can selectively connect a particular signal path to the antenna 641. The first multi-throw switch 642 can electrically connect the transmit signal path to the antenna 641 in a first state, electrically connect the receive signal path to the antenna 641 in a second state, and electrically connect the bypass signal path to the antenna 641 in a third state. The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630. In certain configurations, the control and biasing circuit 647 receives a mode signal indicating a mode of operation of the power amplifier 645. The mode signal can be provided to the control and biasing circuit 647 in a variety of ways, such as over a serial interface (for instance, a MIPI RFFE bus or I²C bus). The control and biasing circuit 647 can use the mode signal for a variety of purposes, including, for example, controlling a voltage level of a supply voltage used to power an output stage of the power amplifier 645.

The RF front end system 640 of FIG. 17B is similar to the RF front end system 630 of FIG. 17A, except that the first multi-throw switch 649 is configured to selectively connect a particular signal path to either a first antenna 641 or a second antenna 648. The multi-throw switch 649 can be a multi-throw, multi-pole switch.

Figure 18A:
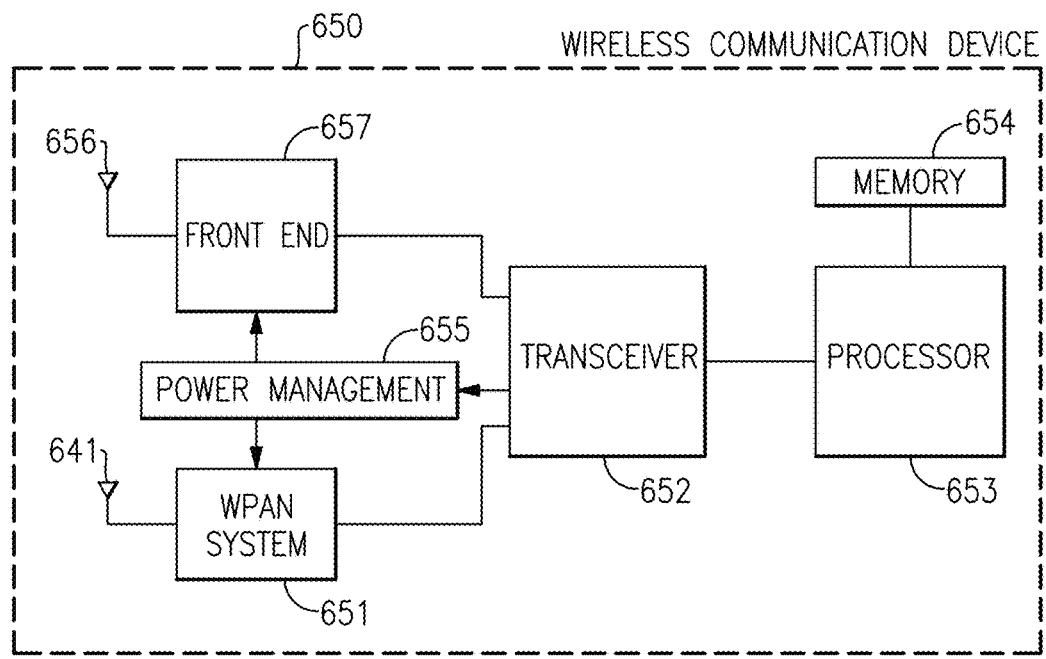
FIG. 18A is a schematic diagram of one example of a wireless communication device.

FIG. 18A is a schematic diagram of one example of a wireless communication device 650. The wireless communication device 650 includes a first antenna 641, a wireless personal area network (WPAN) system 651, a transceiver 652, a processor 653, a memory 654, a power management block 655, a second antenna 656, and a front end system 657.

Any of the suitable combination of features disclosed herein can be implemented in the wireless communication device 650. For example, the WPAN system 651 and/or the front end system 657 can be implemented using any of the features described above and/or in the sections below.

The WPAN system 651 is a front end system configured for processing radio frequency signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

Figure 18B:
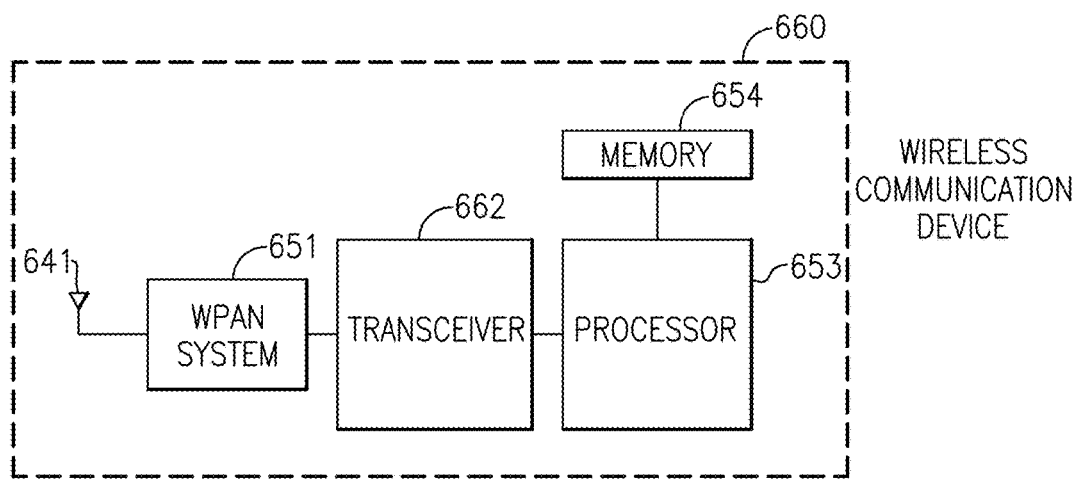
FIG. 18B is a schematic diagram of another example of a wireless communication device.

FIG. 18B is a schematic diagram of another example of a wireless communication device 660. The illustrated wireless communication device 660 of FIG. 18B is a device configured to communicate over a PAN. This wireless communication device 660 can be relatively less complex than the wireless communication device 650 of FIG. 18A. As illustrated, the wireless communication device 660 includes an antenna 641, a WPAN system 651, a transceiver 662, a processor 653, and a memory 654. The WPAN system 660 can include any suitable combination of features disclosed herein. For example, the WPAN system 651 can be implemented using any of the features described above and/or in the sections below.

Figure 18C:
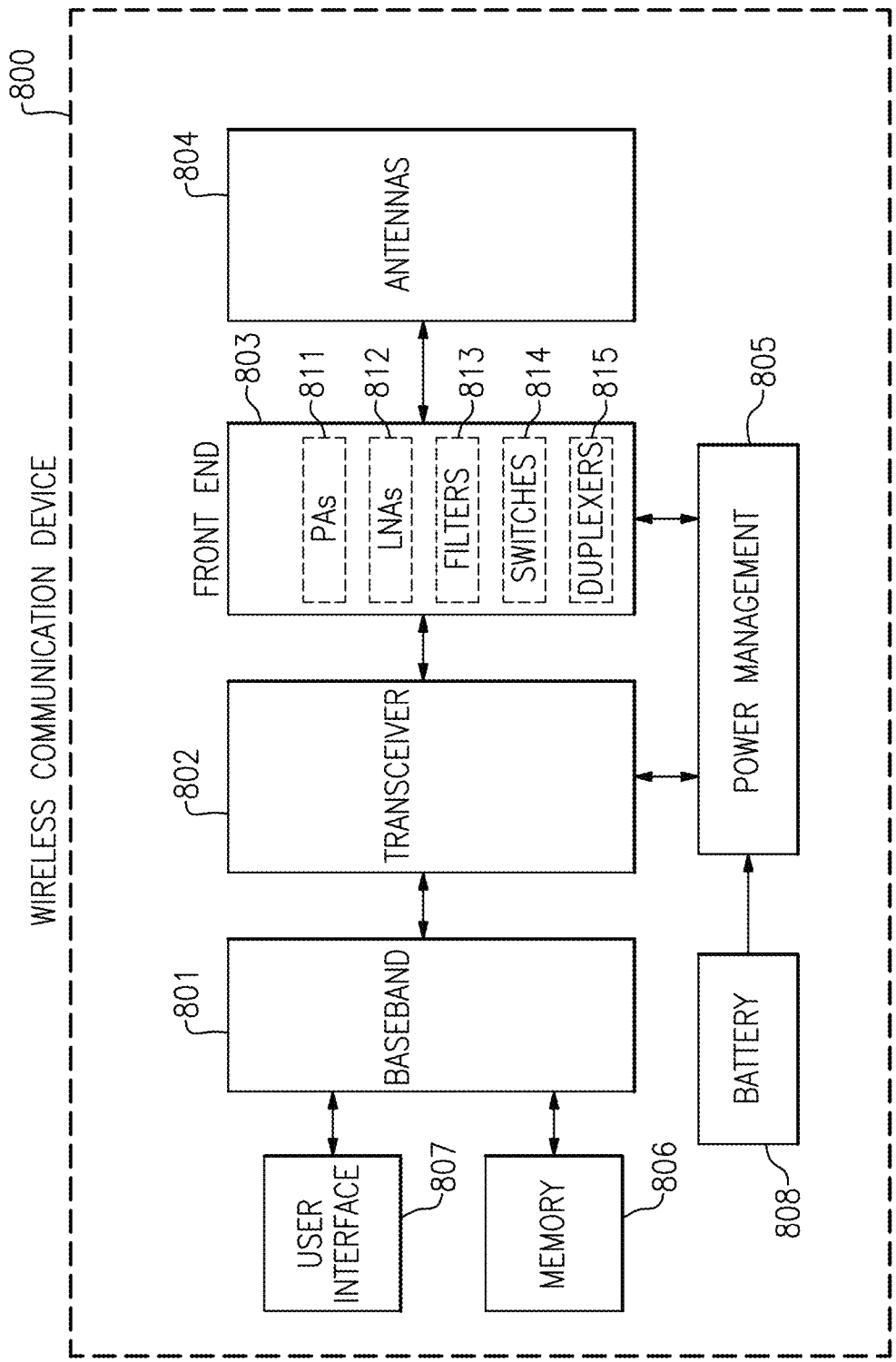
FIG. 18C is a schematic diagram of another example of a wireless communication device.

FIG. 18C is a schematic diagram of another example of a wireless communication device 800. The wireless communication device 800 includes a baseband system 801, a transceiver 802, a front-end system 803, one or more antennas 804, a power management system 805, a memory 806, a user interface 807, and a battery 808.

The wireless communication device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMAX), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 18C as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Any of the suitable combination of features disclosed herein can be implemented in the wireless communication device 800. For example, the front end system 803 can be implemented using any of the features described above and/or in the sections below.

In certain implementations, the wireless communication device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 800 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 18C, the baseband system 801 is coupled to the memory 806 of facilitate operation of the wireless communication device 800.

The memory 806 can be used for a wide variety of purposes, such as storing data and/or instructions to facilitate the operation of the wireless communication device 800 and/or to provide storage of user information.

The power management system 805 provides a number of power management functions of the wireless communication device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 18C, the power management system 805 receives a battery voltage from the battery 808. The battery 808 can be any suitable battery for use in the wireless communication device 800, including, for example, a lithium-ion battery.

Figure 19:
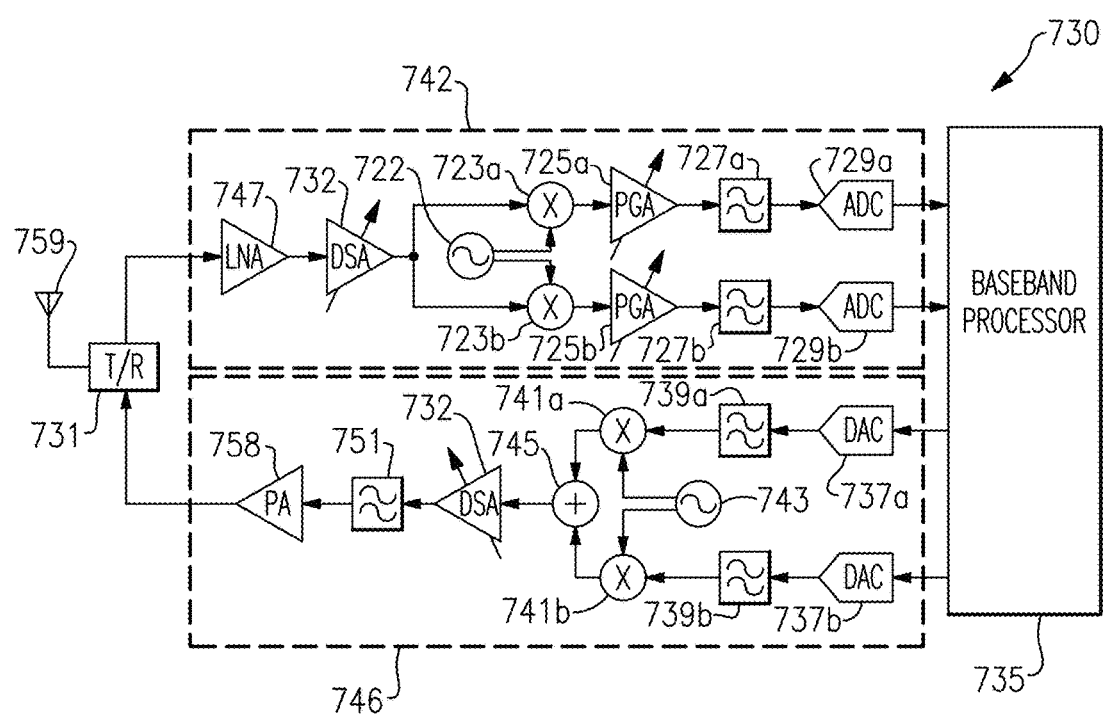
FIG. 19 is a schematic diagram of one embodiment of an RF system.

FIG. 19 is a schematic diagram of one embodiment of an RF system 730. The RF system 730 includes a baseband processor 735, a receive path 742, a transmit path 746, a T/R switch 731, and an antenna 759. The RF system 700 illustrates one example of a communications system architecture that can include one or more RF amplifiers implemented in accordance with the teachings herein.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 746 and the receive path 742 can be used for transmitting and receiving signals over the antenna 759. Although one implementation of the RF system 730 is illustrated in FIG. 19, the RF system 730 can be modified in any suitable manner. For example, the base station 730 can be modified to include additional transmit paths, receive paths, and/or antennas.

In the illustrated configuration, the receive path 742 includes a low noise amplifier (LNA) 747, a digital step attenuator (DSA) 732, a local oscillator 722, a first mixer 723*a*, a second mixer 723*b*, a first programmable gain amplifier (PGA) 725*a*, a second PGA 725*b*, a first filter 727*a*, a second filter 727*b*, a first analog-to-digital converter (ADC) 729*a*, and a second ADC 729*b*. Although one implementation of a receive path is illustrated in FIG. 19, a receive path can include more or fewer components and/or a different arrangement of components.

An RF signal can be received on the antenna 759 and provided to the receive path 742 using the T/R switch 731. For example, the T/R switch 731 can be controlled to electrically couple the antenna 759 to an input of the LNA 747, thereby providing the received RF signal to the LNA's input. The LNA 747 provides low noise amplification such that the LNA 747 amplifies the received RF signal while adding or introducing a relatively small amount of noise. As shown in FIG. 19, the amplified RF signal generated by the LNA 747 is provided to the DSA 732. In the illustrated embodiment, an amount of attenuation provided by the DSA 732 is digitally-controllable, and can be set to achieve a desired signal power level.

The first and second mixers 723*a*, 723*b* receive first and second local oscillator clock signals, respectively, from the local oscillator 722. The first and second local oscillator clock signals can have about the same frequency and a phase difference equal to about a quarter of a period, or about 90°. The first and second mixers 723*a*, 723*b* downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725*a*, 725*b*, respectively. To aid in reducing output noise, the outputs of the first and second programmable gain amplifiers 725*a*, 725*b* can be filtered using the first and second filters 727*a*, 727*b*, which can be any suitable filter, including, for example, low pass, band pass, or high pass filters. The outputs of the first and second filters 727*a*, 727*b* can be provided to the first and second ADCs 729*a*, 729*b*, respectively. The first and second ADCs 729*a*, 729*b* can have any suitable resolution. In the illustrated configuration, the outputs of the first and second ADCs 729*a*, 729*b* are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF system 730.

As shown in FIG. 19, the transmit path 746 receives data from the baseband processor 735 and is used to transmit RF signals via the antenna 759. The transmit path 746 and the receive path 742 both operate using the antenna 759, and access to the antenna 759 is controlled using the T/R switch 731. The illustrated transmit path 746 includes first and second digital-to-analog converters (DACs) 737*a*, 737*b*, first and second filters 739*a*, 739*b*, first and second mixers 741*a*, 741*b*, a local oscillator 743, a combiner 745, a DSA 732, an output filter 751, and a power amplifier 758. Although one implementation of a transmit path is illustrated in FIG. 19, a transmit path can include more or fewer components and/or a different arrangement of components.

The baseband processor 735 can output a digital in-phase (I) signal and a digital quadrature-phase (Q) signal, which can be separately processed until they are combined using the combiner 745. The first DAC 737*a* converts the digital I signal into an analog I signal, and the second DAC 737*b* converts the digital Q signal into an analog Q signal. The first and second DACs 737*a*, 737*b* can have any suitable precision. The analog I signal and the analog Q signal can be filtered using the first and second filters 739*a*, 739*b*, respectively. The outputs of the first and second filters 739*a*, 739*b* can be upconverted using the first and second mixers 741*a*, 741*b*, respectively. For example, the first mixer 741*a* is used to upconvert the output of the first filter 739*a* based on an oscillation frequency of the local oscillator 743, and the second mixer 741*b* is used to upconvert the output of the second filter 739*b* based on the oscillation frequency of the local oscillator 743.

The combiner 745 combines the outputs of the first and second mixers 741*a*, 741*b* to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the T/R switch 731.

The RF amplifiers described herein can be used in the RF system 730 of FIG. 19. For example, one or more RF amplifiers can be used, for instance, for amplification of a transmit signal for transmission via an antenna, amplification of clocks generated by a local oscillator, amplification of the output of a low noise amplifier, amplification of an input or output of a filter, and/or amplification of an input or output to a mixer.

One example application of the RF amplifiers herein is to enable various objects with wireless connectivity, such as for Internet of things (IoT). IoT refers to a network of objects or things, such as devices, vehicles, and/or other items that are embedded with electronics that enable the objects to collect and exchange data (for instance, machine to machine communications) and/or to be remotely sensed and/or controlled.

The RF amplifiers herein can be used to enable wireless connectivity of various objects, thereby allowing such objects to communicate in an IoT network. The RF amplifiers discussed herein can be implemented in IoT applications to enable wireless connectivity to expand the way consumers manage information and their environment. Such RF amplifiers can enable the new and emerging IoT applications, which can bring people and things closer to vital information wherever it is desired. Although IoT is one example application of front RF amplifiers herein, the teachings herein are applicable to a wide range of technologies and applications. Some example IoT applications will now be discussed.

IoT devices can be implemented in automotive systems. From telematics to infotainment systems, lighting, remote keyless entry, collision avoidance platforms, toll transponders, video displays, vehicle tracking tools, and the like, RF amplifiers in accordance with any suitable principles and advantages discussed herein can help enable convenience and safety features for the connected vehicle.

IoT devices can be implemented in connected home environments. RF amplifiers in accordance with any suitable principles and advantages discussed herein can allow homeowners greater control over their home environment. IoT devices can be implemented in a host of devices including smart thermostats, security systems, sensors, light switches, smoke and carbon monoxide alarms, routers, high definition televisions, gaming consoles and much more.

IoT devices can be implemented in industrial contexts. From smart city applications to factory automation, building controls, commercial aircraft, vehicle tracking, smart metering, LED lighting, security cameras, and smart agriculture functions, RF amplifiers in accordance with any suitable principles and advantages discussed herein can enable these applications and meet specifications.

IoT devices can be implemented in machine-to-machine contexts. IoT devices can enable machine-to-machine communications that can transform the way organizations do business. From manufacturing automation to telemetry, remote control devices, and asset management, RF amplifiers discussed herein can provide cellular, short-range, and global positioning solutions that support a wide range of machine-to-machine applications.

IoT devices can be implemented in medical applications. RF amplifiers in accordance with any suitable principles and advantages discussed herein can enable medical devices and the communication of information that is improving the care of millions of people worldwide. RF amplifiers in accordance with any suitable principles and advantages discussed herein can be integrated into product designs that enable the miniaturization of medical devices and enhance data transmission. RF amplifiers, such as power amplifiers, in accordance with any suitable principles and advantages discussed herein can be implemented in medical instruments.

IoT devices can be implemented in mobile devices. The communication landscape has changed in recent years as consumers increasingly seek to be connected everywhere and all the time. RF amplifiers in accordance with any suitable principles and advantages discussed herein can be compact, energy and cost efficient, meeting size and performance constraints, while enabling a great consumer experience. Wireless mobile devices, such as smartphones, tablets and WLAN systems, can include one or more RF amplifiers in accordance with any suitable principles and advantages discussed herein.

IoT devices can be implemented in smart energy applications. Utility companies are modernizing their systems using computer-based remote control and automation that involves two-way communication. Some benefits to utilities and consumers include optimized energy efficiency, leveling and load balancing on the smart grid. RF amplifiers in accordance with any suitable principles and advantages discussed herein can be implemented in smart meters, smart thermostats, in-home displays, ZigBee/802.15.4, Bluetooth, and Bluetooth low energy applications.

IoT devices can be implemented in wearable devices. Wearable devices, such as smartwatches, smart eyewear, fitness trackers and health monitors, can include RF amplifiers in accordance with any suitable principles and advantages discussed herein to enable relatively small form factor solutions that consume relatively low power and enable always on connectivity. This can allow applications to run in the background for lengthy periods of time without a battery recharge, for example.

Any suitable principles and advantages discussed herein can implemented in an IoT network, IoT object, a vehicle, industrial equipment, a corresponding front end system, a corresponding circuit board, the like, or any suitable combination thereof. Some examples will now be discussed.

FIG. 20 is a schematic diagram of one example of an IoT network 1200. The IoT network 1200 includes a smart home 1201, a smart vehicle 1202, a wearable 1203, a mobile device 1204, a base station 1205, a smart hospital 1206, a smart factory 1207, and a smart satellite 1208. One or more of the IoT-enabled objects of FIG. 20 can include a front end system, such as a front end module and/or front-end integrated circuit, implemented in accordance with the teachings herein.

The smart home 1201 is depicted as including a wide variety of IoT-enabled objects, including an IoT-enabled router 1211, an IoT-enabled thermostat 1212, an IoT-enabled meter 1213, IoT-enabled laptop 1214, and an IoT-enabled television 1215. Although various examples of IoT-enable objects for a smart home are shown, a smart home can include a wide variety of IoT-enabled objects. Examples of such IoT-enabled objects include, but are not limited to, an IoT-enabled computer, an IoT-enabled laptop, an IoT-enabled tablet, an IoT-enabled computer monitor, an IoT-enabled television, an IoT-enabled media system, an IoT-enabled gaming system, an IoT-enabled camcorder, an IoT-enabled camera, an IoT-enabled modem, an IoT-enabled router, an IoT-enabled kitchen appliance, an IoT-enabled telephone, an IoT-enabled air conditioner, an IoT-enabled washer, an IoT-enabled dryer, an IoT-enabled copier, an IoT-enabled facsimile machine, an IoT-enabled scanner, an IoT-enabled printer, an IoT-enabled scale, an IoT-enabled home assistant (for instance, a voice-controlled assistant device), an IoT-enabled security system, an IoT-enabled thermostat, an IoT-enabled smoke detector, an IoT-enabled garage door, an IoT-enabled lock, an IoT-enabled sprinkler, an IoT-enabled water heater, and/or an IoT-enabled light.

As shown in FIG. 20, the smart vehicle 1202 also operates in the IoT network 1200. The smart vehicle 1202 can include a wide variety of IoT-enabled objects, including, but not limited to, an IoT-enabled infotainment system, an IoT-enabled lighting system, an IoT-enabled temperature control system, an IoT-enabled lock, an IoT-enabled ignition, an IoT-enabled collision avoidance system, an IoT-enabled toll transponder, and/or an IoT-enabled vehicle tracking system. In certain implementations, the smart vehicle 1202 can communicate with other smart vehicles to thereby provide vehicle-to-vehicle (V2V) communications. Furthermore, in certain implementations the smart vehicle 1202 can operate using vehicle-to-everything (V2X) communications, thereby communicating with traffic lights, toll gates, and/or other IoT-enabled objects.

The wearable 1203 of FIG. 20 is also IoT-enabled. Examples of IoT-enabled wearables include, but are not limited to, an IoT-enabled watch, an IoT-enabled eyewear, an IoT-enabled fitness tracker, and/or an IoT-enabled biometric device.

The IoT network 1200 also includes the mobile device 1204 and base station 1205. Thus, in certain implementations user equipment (UE) and/or base stations of a cellular network can operate in an IoT network and be IoT-enabled. Furthermore, a wide variety of IoT-enabled objects can communication using existing network infrastructure, such as cellular infrastructure.

With continuing reference to FIG. 20, IoT is not only applicable to consumer devices and objects, but also to other applications, such as medical, commercial, industrial, aerospace, and/or defense applications. For example, the smart hospital 1206 can include a wide variety of IoT-enabled medical equipment and/or the smart factory 1207 can include a wide variety of IoT-enabled industrial equipment. Furthermore, airplanes, satellites, and/or aerospace equipment can also be connected to an IoT network. Other examples of IoT applications include, but are not limited to, asset tracking, fleet management, digital signage, smart vending, environmental monitoring, city infrastructure (for instance, smart street lighting), toll collection, and/or point-of-sale.

Although various examples of IoT-enabled objects are illustrated in FIG. 20, an IoT network can include a wide variety of types of objects. Furthermore, any number of such objects can be present in an IoT network. For instance, an IoT network can include millions or billions of IoT-enable objects or things.

IoT-enabled objects can communicate using a wide variety of communication technologies, including, but not limited to, Bluetooth, ZigBee, Z-Wave, 6LowPAN, Thread, Wi-Fi, NFC, Sigfox, Neul, and/or LoRaWAN technologies. Furthermore, certain IoT-enabled objects can communicate using cellular infrastructure, for instance, using 2G, 3G, 4G (including LTE, LTE-Advanced, and/or LTE-Advanced Pro), and/or 5G technologies.

Figure 21A:
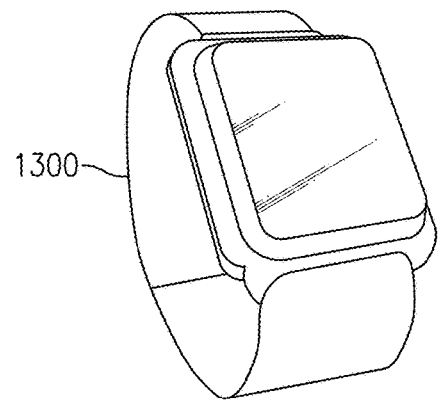
FIG. 21A is a schematic diagram of one example of an IoT-enabled watch.

FIG. 21A is a schematic diagram of one example of an IoT-enabled watch 1300. The IoT-enabled watch 1300 illustrates one example of a smart wearable that can include one or more RF amplifiers implemented in accordance with one or more features disclosed herein.

Figure 21B:
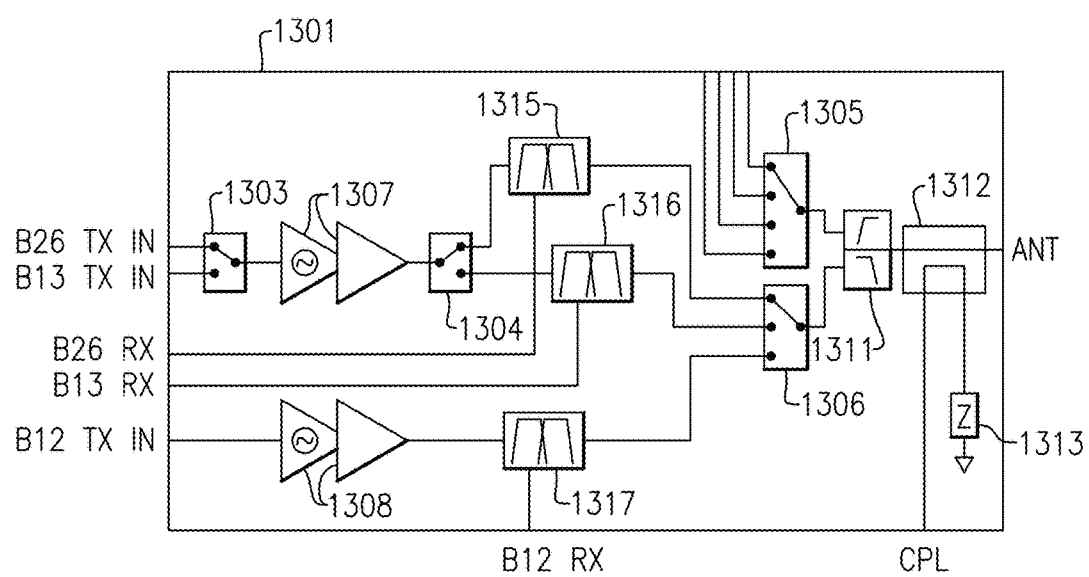
FIG. 21B is a schematic diagram of one example of a front end system for an IoT-enabled object.

FIG. 21B is a schematic diagram of one example of a front end system 1301 for an IoT-enabled object, such as the IoT-enabled watch 1300 of FIG. 21A. The front end system 1301 includes a first transceiver-side switch 1303, a second transceiver-side switch 1304, a first antenna-side switch 1305, a second antenna-side switch 1306, a first power amplifier 1307, a second power amplifier 1308, a duplexer 1311, a directional coupler 1312, a termination impedance 1313, a first band selection filter 1315, a second band selection filter 1316, and a third band selection filter 1317.

In the illustrated embodiment, the first transceiver-side switch 1303 selects between a Band 26 transmit input pin (B26 TX IN) and a Band 13 transmit input pin (B13 TX IN). The second transceiver-side switch 1303 controls connection of the output of the first power amplifier 1307 to the first band selection filter 1315 or the first band selection filter 1316. Thus, the first power amplifier 1307 selectively amplifies Band 26 or Band 13, in this example. Additionally, the second power amplifier 1308 amplifies a Band 12 transmit input pin (B12 TX IN). After suitable filtering by the band selection filters 1315-1317, the second antenna-side switch 1306 selects a desired transmit signal for providing to an antenna pin (ANT) via the duplexer 1311 and the directional coupler 1312. As shown in FIG. 21B, the directional coupler 1312 is terminated by the termination impedance 1313. Additionally, the first antenna-side switch 1305 provides a signal received on the antenna pin (ANT) to a desired receive output pin (four in this example) of the front end system 1301. The illustrated front end system 1301 also includes various additional pins to provide additional functionality, such as enhanced monitoring of transmit power. For instance, front end system 1301 includes a directional coupler output pin (CPL), and feedback pins (B12 RX, B13 RX, and B26 RX) for providing feedback signals associated with transmit signals (for Band 12, Band 13, and Band 26, respectively) generated by the power amplifiers.

The front end system 1301 can incorporate one or more features described in the sections herein.

Figure 22A:
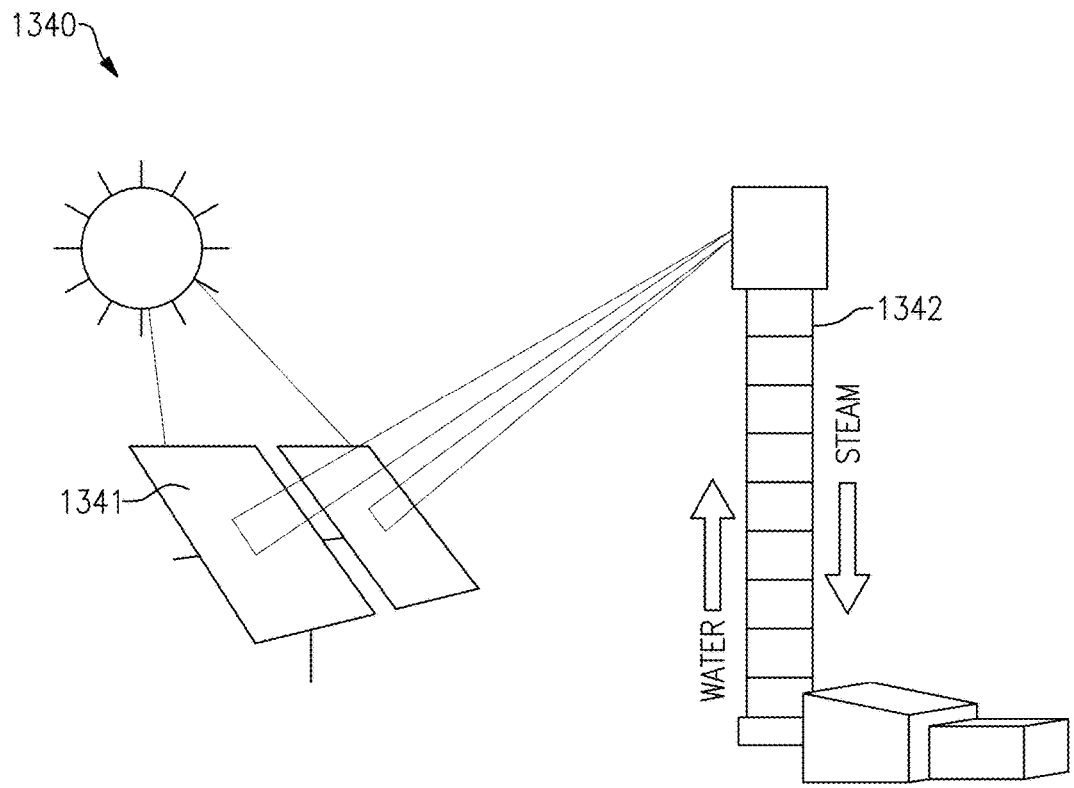
FIG. 22A is a schematic diagram of one example of IoT-enabled industrial equipment.

FIG. 22A is a schematic diagram of one example of IoT-enabled industrial equipment 1340. In the illustrated embodiment, the IoT-enabled industrial equipment 1340 includes heliostats 1341 for reflecting light to a solar receiver and turbine 1342. The IoT-enabled industrial equipment 1340 can include one or more front end systems for a variety of purposes, such as providing angular positional control of the heliostats 1341 to control concentration of solar energy directed toward the solar receiver and turbine 1342. The IoT-enabled industrial equipment 1340 can include a front end system implemented in accordance with one or more features disclosed herein.

Figure 22B:
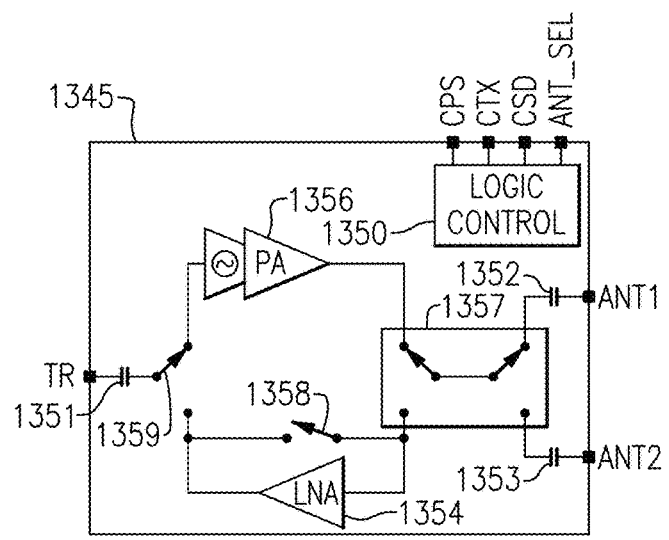
FIG. 22B is a schematic diagram of another example of a front end system for an IoT-enabled object.

FIG. 22B is a schematic diagram of another example of a front end system 1345 for an IoT-enabled object, such as the IoT-enabled industrial equipment 1340 of FIG. 22A.

The front end system 1345 includes a logic control circuit 1350, a transceiver DC blocking capacitor 1351, a first antenna DC blocking capacitor 1352, a second antenna DC blocking capacitor 1353, an LNA 1354, a power amplifier 1356, an antenna-side switch 1357, a bypass switch 1358, and a transceiver-side switch 1359.

The front end system 1345 includes control pins (CPS, CTX, CSD, ANT_SEL) for controlling the front end system 1345. The antenna-side switch 1357 selectively connects either a first antenna pin (ANT1) or a second antenna pin (ANT2) to either an output of the power amplifier 1356 or the bypass switch 1358/input to the LNA 1354. Additionally, the bypass switch 1358 selectively bypasses the LNA 1354. Furthermore, the transceiver-side switch 1359 selectively connected the transceiver pin (TR) to either an input of the power amplifier 1356 or the bypass switch 1358/output to the LNA 1354. The DC blocking capacitors 1351-1353 serve to provide DC blocking to provide enhanced flexibility in controlling internal DC biasing of the front end system 1345.

The front end system 1345 can incorporate one or more features described in the sections herein.

Figure 23A:
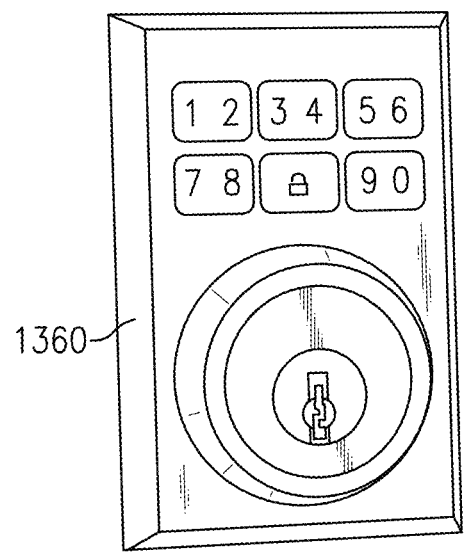
FIG. 23A is a schematic diagram of one example of an IoT-enabled lock.

FIG. 23A is a schematic diagram of one example of an IoT-enabled lock 1360. The IoT-enabled lock 1360 illustrates one example of an IoT-enabled object that can include a front end system implemented in accordance with one or more features disclosed herein.

Figure 23B:
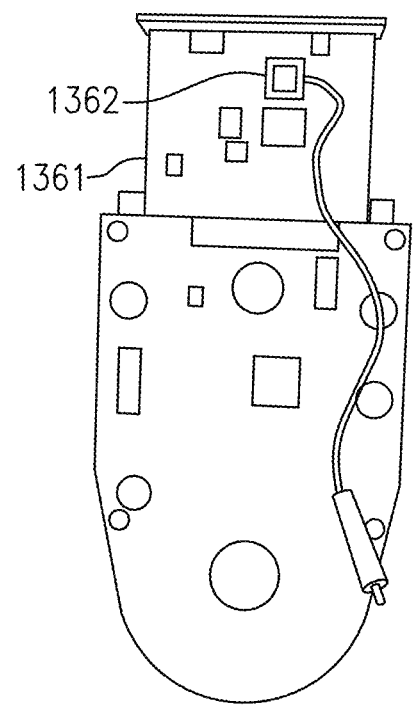
FIG. 23B is a schematic diagram of one example of a circuit board for the IoT-enabled lock of FIG. 23A.

FIG. 23B is a schematic diagram of one example of a circuit board 1361 for the IoT-enabled lock 1360 of FIG. 23A. The circuit board 1361 includes a front end system 1362, which can incorporate one or more features described in the sections herein.

Figure 24A:
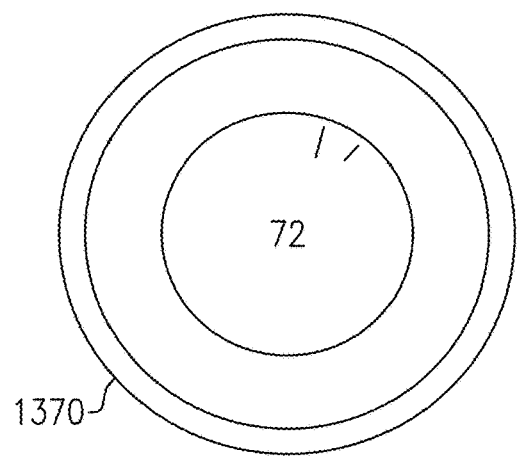
FIG. 24A is a schematic diagram of one example of an IoT-enabled thermostat.

FIG. 24A is a schematic diagram of one example of IoT-enabled thermostat 1370. The IoT-enabled thermostat 1370 illustrates another example of an IoT-enabled object that can include a front end system implemented in accordance with one or more features disclosed herein.

Figure 24B:
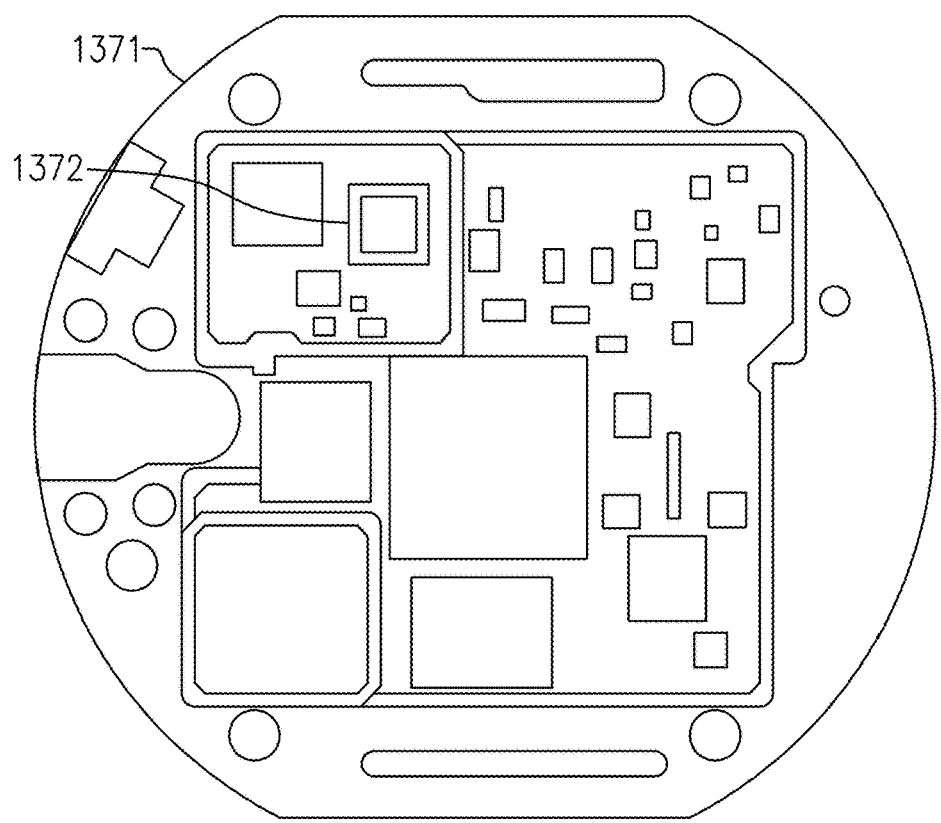
FIG. 24B is a schematic diagram of one example of a circuit board for the IoT-enabled thermostat of FIG. 24A.

FIG. 24B is a schematic diagram of one example of a circuit board 1371 for the IoT-enabled thermostat 1370 of FIG. 24A. The circuit board 1371 includes a front end system 1372, which can incorporate one or more features described in the sections herein.

Figure 25A:
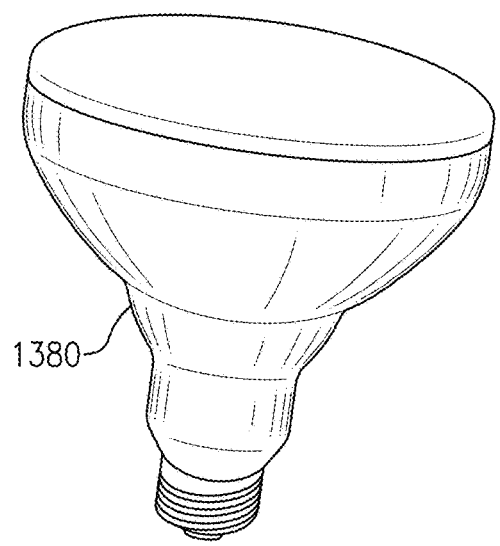
FIG. 25A is a schematic diagram of one example of IoT-enabled light.

FIG. 25A is a schematic diagram of one example of IoT-enabled light 1380. The IoT-enabled light 1380 illustrates another example of an IoT-enabled object that can include a front end system implemented in accordance with one or more features disclosed herein.

Figure 25B:
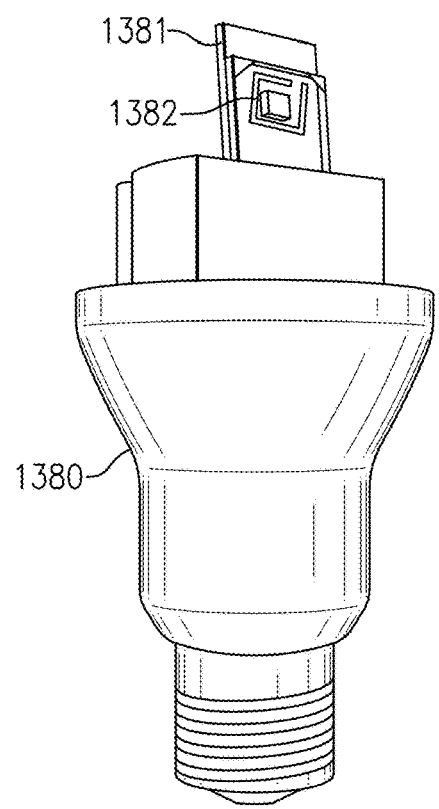
FIG. 25B is a schematic diagram of one example of a circuit board for the IoT-enabled light of FIG. 25A.

FIG. 25B is a schematic diagram of one example of a circuit board 1381 for the IoT-enabled light 1380 of FIG. 25A. FIG. 25B also depicts a base portion of the IoT-enabled light 1380 for housing the circuit board 1381. The circuit board 1381 includes a front end system 1382, which can incorporate one or more features described in the sections herein.

Although FIGS. 14A-25B illustrate examples of electronic systems that can include an RF amplifier implemented in accordance with the teachings herein, RF amplifier can be used in other configurations of electronics.

Applications

Some of the embodiments described above have provided examples in connection with power amplifiers, front end modules and/or wireless communications devices. However, the principles and advantages of the embodiments can be used for any other systems or apparatus that have needs for RF amplifiers.

For example, RF amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency amplifier comprising:
   an input terminal configured to receive a radio frequency input signal;
   an output terminal configured to provide a radio frequency output signal;
   a driver stage including an injection-locked oscillator configured to generate an injection-locked radio frequency signal based on the radio frequency input signal; and
   a stacked output stage configured to amplify the injection-locked radio frequency signal to generate the radio frequency output signal, the stacked output stage including a transistor stack of at least a first transistor and a second transistor in series with one another, the stacked output stage having an adjustable supply voltage that changes with a mode of the radio frequency amplifier.

2. The radio frequency amplifier of claim 1 wherein the stacked output stage is operable in at least a first mode and a second mode.

3. The radio frequency amplifier of claim 2 further comprising a bias circuit configured to bias the second transistor to a linear region of operation in the first mode, and to bias the second transistor as a switch in the second mode.

4. The radio frequency amplifier of claim 2 wherein the stacked output stage is configured to receive a supply voltage having a lower voltage level in the second mode relative to the first mode.

5. The radio frequency amplifier of claim 2 further comprising a switch configured to provide the injection-locked radio frequency signal to the second transistor in the first mode, and to provide the injection-locked radio frequency signal to the first transistor in the second mode.

6. The radio frequency amplifier of claim 1 wherein the first transistor is a common source transistor, and the second transistor is a common gate transistor.

7. The radio frequency amplifier of claim 1 wherein the driver stage is a power amplifier input stage, and the stacked output stage is a power amplifier output stage.

8. The radio frequency amplifier of claim 1 wherein the driver stage is powered by a substantially fixed supply voltage.

9. The radio frequency amplifier of claim 1 wherein the radio frequency input signal is a single-ended input signal, and the injection-locked oscillator includes an input transformer configured to convert the single-ended input signal to a differential input signal.

10. The radio frequency amplifier of claim 1 wherein the injection-locked oscillator includes a negative transconductance circuit electrically connected to an inductor-capacitor tank, the negative transconductance circuit configured to provide energy to the inductor-capacitor tank to maintain oscillations.

11. The radio frequency amplifier of claim 10 wherein the injection-locked oscillator further includes a signal injecting circuit configured to provide signal injection to the inductor-capacitor tank based on the radio frequency input signal.

12. The radio frequency amplifier of claim 10 wherein the injection-locked oscillator further includes an output transformer configured to generate the injection-locked radio frequency signal at the output of the driver stage.

13. A method of radio frequency signal amplification, the method comprising:
receiving a radio frequency input signal as an input to a radio frequency amplifier having a driver stage and a stacked output stage;
generating an injection-locked radio frequency signal based on the radio frequency input signal using an injection-locked oscillator of the driver stage;
amplifying the injection-locked radio frequency signal using a transistor stack of the stacked output stage, the transistor stack including at least a first transistor and a second transistor in series with one another;
operating the stacked output stage in a selected mode chosen from at least a first mode and a second mode; and
providing the stacked output stage with an adjustable supply voltage having a lower voltage level in the second mode relative to the first mode.

14. The method of claim 13 further comprising biasing the second transistor to a linear region of operation in the first mode, and biasing the second transistor as a switch in the second mode.

15. A wireless communication device comprising:
a transmitter configured to generate a radio frequency input signal;
a power amplifier including a driver stage and a stacked output stage, the driver stage including an injection-locked oscillator configured to generate an injection-locked radio frequency signal based on the radio frequency input signal, and the stacked output stage configured to amplify the injection-locked radio frequency signal to generate an output radio frequency signal, the stacked output stage including a transistor stack of at least a first transistor and a second transistor in series with one another and powered by a second supply voltage; and
a supply control circuit configured to generate the second supply voltage, the supply control circuit configured to receive a mode control signal from the transmitter.

16. The wireless communication device of claim 15 further comprising a switch and an antenna electrically connected to an output of the stacked output stage via the switch.

17. The wireless communication device of claim 15 further comprising a bias circuit configured to bias the second transistor to a linear region of operation in a first mode, and to bias the second transistor as a switch in a second mode.

18. The wireless communication device of claim 17 wherein the supply control circuit is further configured to control the second supply voltage to a lower voltage level in the second mode relative to the first mode.

19. The wireless communication device of claim 15 wherein the power amplifier further includes a switch configured to provide the injection-locked radio frequency signal to the second transistor in the first mode, and to provide the injection-locked radio frequency signal to the first transistor in the second mode.

20. The wireless communication device of claim 15 wherein the injection-locked oscillator includes a negative transconductance circuit electrically connected to an inductor-capacitor tank, the negative transconductance circuit configured to provide energy to the inductor-capacitor tank to maintain oscillations.

* * * * *